United States Patent
Lee et al.

(10) Patent No.: US 12,207,457 B2
(45) Date of Patent: Jan. 21, 2025

(54) SEMICONDUCTOR DEVICES AND METHODS OF MANUFACTURING THE SAME

(71) Applicant: Samsung Electronics Co., Ltd., Suwon-si (KR)

(72) Inventors: Yanghee Lee, Incheon (KR); Jonghyuk Park, Suwon-si (KR); Ilyoung Yoon, Hwaseong-si (KR); Boun Yoon, Suwon-si (KR); Heesook Cheon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/413,434

(22) Filed: Jan. 16, 2024

(65) Prior Publication Data

US 2024/0155830 A1     May 9, 2024

Related U.S. Application Data

(63) Continuation of application No. 17/859,247, filed on Jul. 7, 2022, now Pat. No. 11,910,594, which is a (Continued)

(30) Foreign Application Priority Data

Oct. 30, 2019    (KR) .................. 10-2019-0136634

(51) Int. Cl.
*H10B 12/00*     (2023.01)

(52) U.S. Cl.
CPC ......... *H10B 12/37* (2023.02); *H10B 12/0387* (2023.02); *H10B 12/482* (2023.02); *H10B 12/50* (2023.02)

(58) Field of Classification Search
CPC ......... H01L 27/10829; H01L 27/10885; H01L 27/10897; H01L 27/1087; H01L 27/10888;
(Continued)

(56) References Cited

U.S. PATENT DOCUMENTS

| | | | |
|---|---|---|---|
| 6,936,540 B2 | 8/2005 | Andreas | |
| 9,305,924 B2 * | 4/2016 | Mikasa | ............. H01L 27/10876 |

(Continued)

FOREIGN PATENT DOCUMENTS

| | | | |
|---|---|---|---|
| KR | 10-2000-0027785 A | 5/2000 | |
| KR | 20080001396 A | 1/2008 | |

(Continued)

*Primary Examiner* — Edward Chin
(74) *Attorney, Agent, or Firm* — Muir Patent Law, PLLC

(57) ABSTRACT

A semiconductor device includes a substrate including first and second region, a bit line structure on the first region, key structures on the second region, each key structure having an upper surface substantially coplanar with an upper surface of the bit line structure, a first trench disposed between two adjacent key structures spaced apart from each other in a first direction, a filling pattern in a lower portion of the first trench, the filling pattern having a flat upper surface and including a first conductive material, and a first conductive structure on the flat upper surface of the filling pattern, an upper sidewall of the first trench, and the upper surface of each of the plurality of key structures, the first conductive structure including a second conductive material.

20 Claims, 42 Drawing Sheets

Related U.S. Application Data continuation of application No. 16/903,040, filed on Jun. 16, 2020, now Pat. No. 11,411,004.

(58) Field of Classification Search
CPC ......... H01L 27/10873; H01L 27/10814; H01L 27/10823; H01L 27/10876; H01L 21/28061; H01L 21/28035; H01L 21/76897; H01L 21/76816

See application file for complete search history.

(56) References Cited

U.S. PATENT DOCUMENTS

| | | | |
|---|---|---|---|
| 2006/0148275 A1* | 7/2006 | Han | G03F 9/708 |
| | | | 257/E23.179 |
| 2007/0020879 A1* | 1/2007 | Baek | H01L 21/76229 |
| | | | 438/424 |
| 2007/0032015 A1* | 2/2007 | Itoh | H10B 53/00 |
| | | | 257/E23.179 |
| 2007/0054471 A1 | 3/2007 | Chen et al. | |
| 2008/0054484 A1 | 3/2008 | Shim | |
| 2010/0314720 A1* | 12/2010 | Tsutsue | H01L 23/562 |
| | | | 257/618 |
| 2014/0051246 A1* | 2/2014 | Kim | H01L 21/7684 |
| | | | 438/666 |
| 2017/0213834 A1* | 7/2017 | Wang | H01L 28/00 |
| 2017/0345769 A1* | 11/2017 | Wang | H01L 23/585 |
| 2018/0158773 A1* | 6/2018 | Hong | H01L 27/11568 |
| 2018/0331046 A1* | 11/2018 | Lee | H01L 23/544 |
| 2018/0358363 A1* | 12/2018 | Nagai | H01L 27/10885 |
| 2019/0164975 A1* | 5/2019 | Song | H01L 27/10888 |
| 2019/0206873 A1* | 7/2019 | Kim | H01L 27/10888 |
| 2019/0341358 A1 | 11/2019 | Lee et al. | |
| 2020/0027842 A1* | 1/2020 | Lee | H01L 29/41791 |
| 2020/0118929 A1* | 4/2020 | Kim | H01L 23/5226 |
| 2021/0050221 A1* | 2/2021 | Kim | H01L 21/31144 |
| 2021/0050307 A1* | 2/2021 | Tsai | H01L 21/74 |
| 2021/0057328 A1* | 2/2021 | Lee | H01L 23/5222 |
| 2021/0134806 A1* | 5/2021 | Lee | H10B 12/05 |
| 2023/0044131 A1* | 2/2023 | Park | H01L 25/50 |
| 2023/0068748 A1* | 3/2023 | Matsuura | H01L 23/4952 |

FOREIGN PATENT DOCUMENTS

| | | |
|---|---|---|
| KR | 100800786 B1 | 2/2008 |
| KR | 20080002481 U | 7/2008 |
| KR | 20080069477 A | 7/2008 |
| KR | 20090009388 U | 9/2009 |
| KR | 10-2018-0036879 A | 4/2018 |

* cited by examiner

FIG. 2
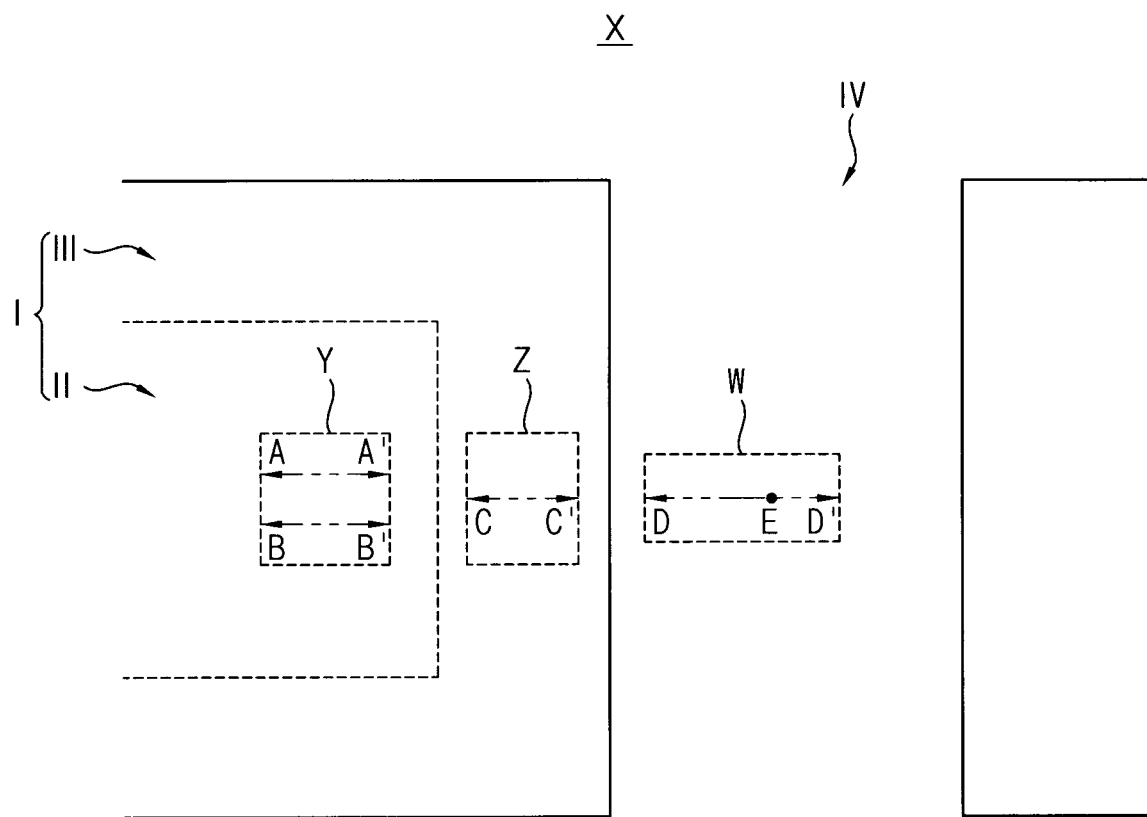
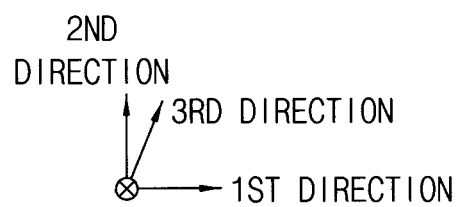

SEMICONDUCTOR DEVICES AND METHODS OF MANUFACTURING THE SAME

CROSS-REFERENCE TO RELATED APPLICATION

This application is a continuation of U.S. application Ser. No. 17/859,247 filed on Jul. 7, 2022, which a continuation of U.S. application Ser. No. 16/903,040 filed on Jun. 16, 2020, issued as U.S. Pat. No. 11,411,004 on Aug. 9, 2022, which claims priority under 35 U.S.C. § 119 to Korean Patent Application No. 10-2019-0136634 filed on Oct. 30, 2019 in the Korean Intellectual Property Office, the disclosure of each of which is hereby incorporated by reference in its entirety.

TECHNICAL FIELD

Example embodiments of the present disclosure relate to semiconductor devices and methods of manufacturing the same, and more specifically, to dynamic random access memory (DRAM) devices and methods of manufacturing the same.

DISCUSSION OF RELATED ART

Structures in a chip region of a DRAM device may be formed by using an overlay key on a scribe lane region of a semiconductor wafer. The overlay key may include key structures and a trench therebetween. If residue generated during processes for forming structures on a chip region of the semiconductor wafer is stuck in the trench not to be removed in a cleansing process, the residue may damage other structures during subsequent processes.

SUMMARY

Example embodiments provide a semiconductor device having improved electrical characteristics.

Example embodiments provide a method of manufacturing a semiconductor device having improved electrical characteristics.

According to an exemplary embodiment of the present invention, a semiconductor device includes a substrate including a first region and a second region surrounding the first region, a bit line structure on the first region of the substrate, a plurality of key structures on the second region of the substrate, each of the key structures having an upper surface substantially coplanar with an upper surface of the bit line structure, a first trench disposed between two adjacent key structures of the plurality of key structures, wherein the two adjacent key structures are spaced apart from each other in a first direction substantially parallel to an upper surface of the substrate, a filling pattern in a lower portion of the first trench, the filling pattern having a flat upper surface and including a first conductive material, and a first conductive structure on the flat upper surface of the filling pattern, an upper sidewall of the first trench, and the upper surface of each of the plurality of key structures, the first conductive structure including a second conductive material.

According to an exemplary embodiment of the present invention, a semiconductor device includes a substrate including a first region and a second region surrounding the first region, a plurality of key structures on the second region of the substrate, each of the plurality of key structures including an insulation pattern, a first conductive structure, a barrier pattern, a metal pattern and a capping pattern sequentially stacked, a first trench disposed between two adjacent key structures of the plurality of key structures that are spaced apart from each other in a first direction substantially parallel to an upper surface of the substrate, a filling pattern in a lower portion of the first trench, the filling pattern having a flat upper surface and including a conductive material, and a second conductive structure on the flat upper surface of the filling pattern, an upper sidewall of the first trench, and upper surfaces of the plurality of key structures.

According to an exemplary embodiment of the present inventive concept, a semiconductor device includes a substrate including a first region and a second region surrounding the first region, the substrate including first and second active patterns on the first region and the second region, respectively, the first and second active patterns being defined by an isolation pattern on the substrate, a first gate structure in an upper portion of the first active pattern, a plurality of bit line structures on the first region of the substrate, a first contact plug structure on the first active pattern and between two adjacent bit line structures of the plurality of bit line structures, a capacitor on the first contact plug structure, a plurality of key structures on the second region of the substrate, each of the plurality of key structures having an upper surface substantially coplanar with an upper surface of each of the plurality of bit line structures, a trench disposed between two adjacent key structures of the plurality of key structures that are spaced apart from each other, a filling pattern in a lower portion of the trench, the filling pattern having a flat upper surface and including a conductive material, and a first conductive structure on the flat upper surface of the filling pattern, an upper sidewall of the trench, and the upper surface of each of the plurality of key structures.

According to an exemplary embodiment of the present invention, a semiconductor device includes a substrate including a first region and a second region surrounding the first region, a bit line structure on the first region of the substrate, a key structure on the second region of the substrate, the key structure having the same stacked structure as the bit line structure, and a filling pattern and a first conductive structure sequentially stacked adjacent to the key structure. The filling pattern has a flat upper surface and includes a conductive material. The first conductive structure is formed on the flat upper surface of the filling pattern and an upper surface of the key structure.

According to an exemplary embodiment of the present invention, a method of manufacturing a semiconductor device includes forming a plurality of first structures and a plurality of key structures on a first region and a second region, respectively, of a substrate, the second region surrounding the first region, the plurality of first structures being spaced apart from each other by a first trench, and the plurality of key structures being spaced apart from each other by a second trench, forming a first filling layer on the plurality of first structures and the plurality of key structures to fill the first trench and the second trench, wherein the first filling layer has a first height difference among portions of the first filling layer, performing a melting process on the first filling layer to form a second filling layer, wherein the second filling layer has a second height difference among portions of the second filling layer, the second height difference being smaller than the first height difference, planarizing the second filling layer until upper surfaces of the plurality of first structures and the plurality of key structures are exposed to form first and second filling patterns between the plurality of first structures and between the plurality of key structures respectively, removing upper portions of the first and second filling patterns, forming a conductive layer on the first and second filling patterns, the plurality of first structures, and the plurality of key structures, planarizing the conductive layer to form a planarized conductive layer, and patterning a first portion of the planarized conductive layer on the first region of the substrate using a second portion of the planarized conductive layer on the second filling pattern as an overlay key. The second portion of the planarized conductive layer includes an upper surface defining a third trench as the overlay key.

According to an exemplary embodiment of the present invention, a method of manufacturing a semiconductor device includes forming a plurality of first structures and a plurality of second structures on a first region and a second region, respectively, of a substrate, the second region surrounding the first region, the plurality of first structures being spaced apart from each other by a first trench having a first width, and the plurality of second structures being spaced apart from each other by a second trench having a second width greater than the first width, forming a first filling layer in the first trench and the second trench, portions of the first filling layer on the second region of the substrate having a height difference from each other, performing a melting process on the first filling layer to form a second filling layer, wherein a height difference among portions of the second filling layer is smaller than the height difference among the portions of the first filling layer, planarizing the second filling layer until upper surfaces of the plurality of first structures and upper surfaces of the plurality of second structures are exposed to form a plurality of first filling patterns between the plurality of first structures and a plurality of second filling patterns between the plurality of second structures respectively, removing upper portions of the plurality of first filling patterns and upper portions of the plurality of second filling patterns, and forming a conductive layer with a third trench on the plurality of first filling patterns and the plurality of second filling patterns.

According to an exemplary embodiment of the present invention, a method of manufacturing a semiconductor device includes forming a plurality of bit line structures and a plurality of key structures on a cell region and a second region, respectively, of a substrate, the substrate including a first region having the cell region and a peripheral circuit region at least partially surrounding the cell region, the second region surrounding the first region, the plurality of bit line structures being spaced apart from each other by a first trench, and the plurality of key structures being spaced apart from each other by a second trench, forming a first conductive layer on the plurality of bit line structures and the plurality of key structures to fill the first trench and the second trench, performing a melting process on the first conductive layer to form a second conductive layer, wherein a height difference among portions of the second conductive layer is smaller than a height difference among portions of the first conductive layer, planarizing the second conductive layer until upper surfaces of the plurality of bit line structures and upper surfaces of the plurality of key structures are exposed to form a lower contact plug between two adjacent bit line structures of the plurality of bit line structures and a filling pattern between two key structures of the plurality of key structures, removing an upper portion of the lower contact plug and an upper portion of the filling pattern, forming a second conductive layer with a third trench on the lower contact plug, the filling pattern, the plurality of bit line structures, and the plurality of key structures, planarizing the second conductive layer to form a planarized second conductive layer with a fourth trench, and patterning portions of the planarized second conductive layer on the cell region and the peripheral circuit region, respectively, of the substrate to form an upper contact plug and a wiring, respectively. Patterning of the portions of the planarized second conductive layer includes aligning a mask for the patterning of the portion of the planarized second conductive layer using the fourth trench of the planarized second conductive layer as an overlay key.

In a method of manufacturing a semiconductor device in accordance with example embodiments, slurry particles remaining in a trench serving as an overlay key after a CMP process may not damage other structures. The overlay key may have an almost vertical sidewall, and thus wirings may be formed to have a desired shape and layout using the overlay key. Accordingly, the semiconductor device may have improved electrical characteristics.

BRIEF DESCRIPTION OF THE DRAWINGS

FIGS. 1 to 38 are plan views and cross-sectional views illustrating a method of manufacturing a semiconductor device according to example embodiments.

DETAILED DESCRIPTION

The above and other aspects and features of the semiconductor devices and the methods of manufacturing the same in accordance with example embodiments will become readily understood from detail descriptions that follow, with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of inventive concepts.

FIGS. 1 to 38 are plan views and cross-sectional views illustrating a method of manufacturing a semiconductor device according to example embodiments. Specifically, FIGS. 1-3, 6, 11, 22 and 35 are the plan views, and FIGS. 4-5, 7-10, 12-21, 23-34 and 36-38 are the cross-sectional views.

FIG. 2 is an enlarged cross-sectional view of a region X of FIG. 1, FIGS. 3, 6, 11, 22 and 35 are enlarged cross-sectional views of regions Y and Z of FIG. 2, FIGS. 4, 7, 9, 12, 14, 16, 18, 20, 23-24, 26, 28, 31, 33 and 36 include cross-sections taken along lines A-A' and B-B' of region Y of corresponding plan views, and FIGS. 5, 8, 10, 13, 15, 17, 19, 21, 25, 27, 29-30, 32, 34 and 37-38 include cross-sections taken along lines C-C' and D-D' of regions Z and W of corresponding plan views.

Hereinafter in the specifications (not necessarily in the claims), two directions substantially parallel to an upper surface of a substrate 100 and substantially perpendicular to each other may be defined as first and second directions, respectively, and a direction substantially parallel to an upper surface of the substrate 100 and having an acute angle with each of the second and third directions may be defined as a third direction.

Figure 1:
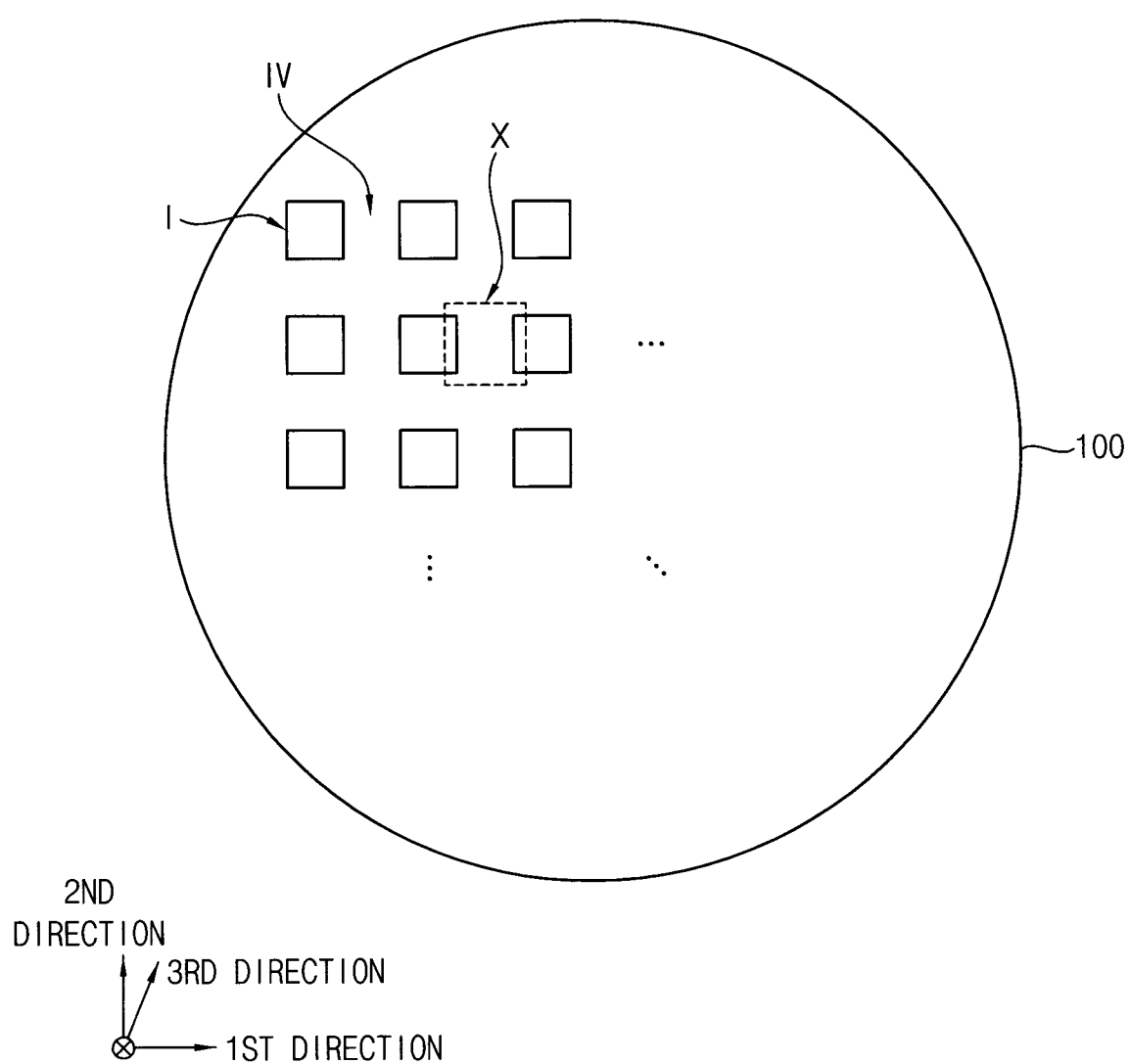

Referring to FIGS. 1 and 2, the substrate (i.e., a semiconductor wafer) 100 may include first and fourth regions I and IV, and the first region I may include second and third regions II and III.

The substrate 100 may be a semiconductor wafer including silicon, germanium, silicon-germanium, or a III-V group compound semiconductor, such as GaP, GaAs, or GaSb. In example embodiments, the substrate 100 may be a silicon-on-insulator (SOI) wafer or a germanium-on-insulator (GOI) wafer. The first region I of the substrate 100 may be a chip region in which patterns for semiconductor chips may be formed. In example embodiments, a plurality of first regions I may be spaced apart from each other in each of the first and second directions. Each of the first regions I may include the second region II in which memory cells may be formed, and thus may be referred to as a cell region, and the third region III surrounding the second region II in which peripheral circuit patterns for driving the memory cells may be formed, and thus may be referred to as a peripheral circuit region.

The fourth region IV of the substrate 100 may be formed between the first regions I, and may be a scribe lane region to be cut for separating the first regions I on the substrate 100 into semiconductor chips. In example embodiments, a test element group (TEG) for testing electrical characteristics or failure of elements included in the semiconductor chips, an alignment key or overlay key for aligning in a photo process, etc., may be formed on the fourth region IV of the substrate 100. The alignment key may be used for aligning an exposure mask at a correct position over the substrate 100 in a photolithography process, and the overlay key may be used for detecting overlay status between a material pattern on the substrate 100 and a photoresist pattern thereon to correct the overlay and misalignment of the photoresist pattern. The scribe line region may be disposed between each adjacent pair of the first regions I, which are adjacent to each other in both of the first and second directions. The scribe lines may be linearly extending regions denoting where the semiconductor wafer (after formation of the semiconductor devices in the chip regions) may be cut to separate the resulting semiconductor chips from each other. Each of the resulting semiconductor chips may include the first region I and a portion of the scribe lane left after the separation. In some examples, the scribe lanes may have no circuitry (e.g., no transistors) that is necessary for the operation of the resulting semiconductor devices (such as no transistors, wires, etc. at all, or only dummy structures, such as one or more of dummy transistors, wires, etc.).

Hereinafter, the overlay key will be formed on the region W of the fourth region IV of the substrate 100, however, the inventive concept may not be limited thereto, and the alignment key may be formed on the region W of the fourth region IV of the substrate 100.

Figure 3:
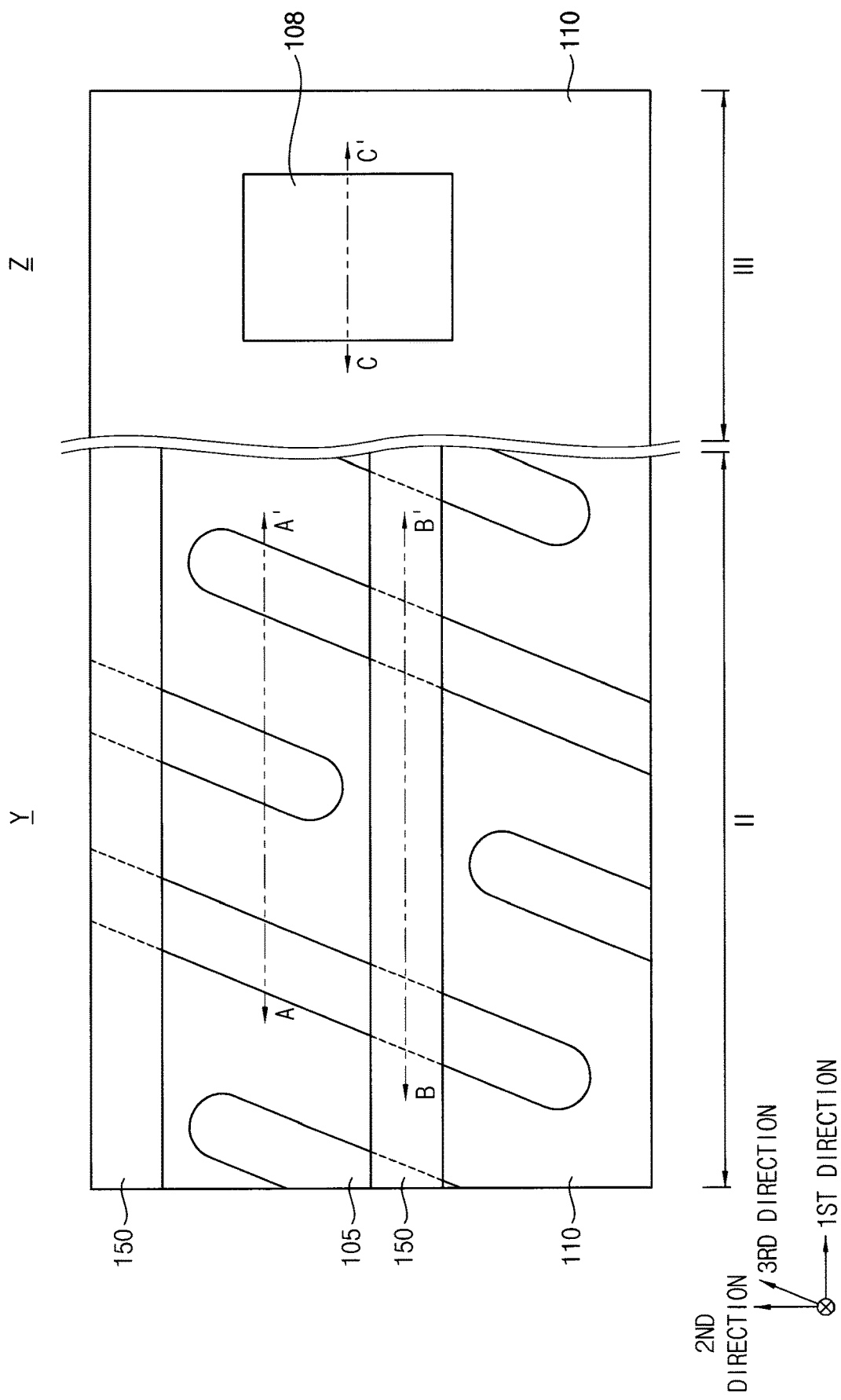
Figure 4:
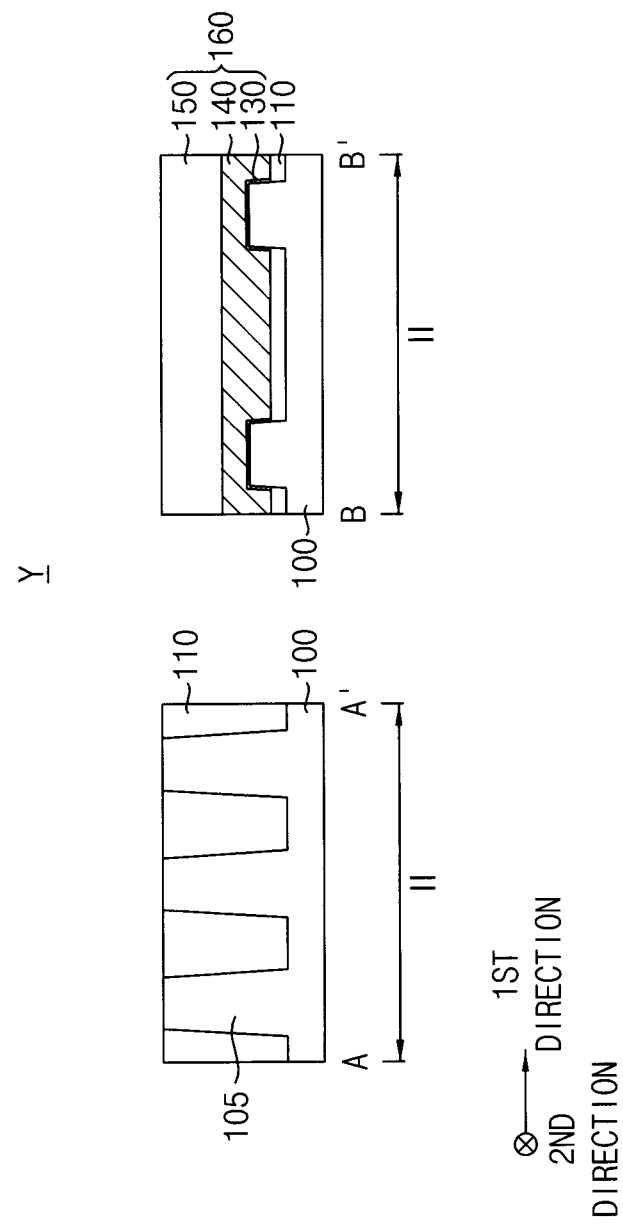
Figure 5:
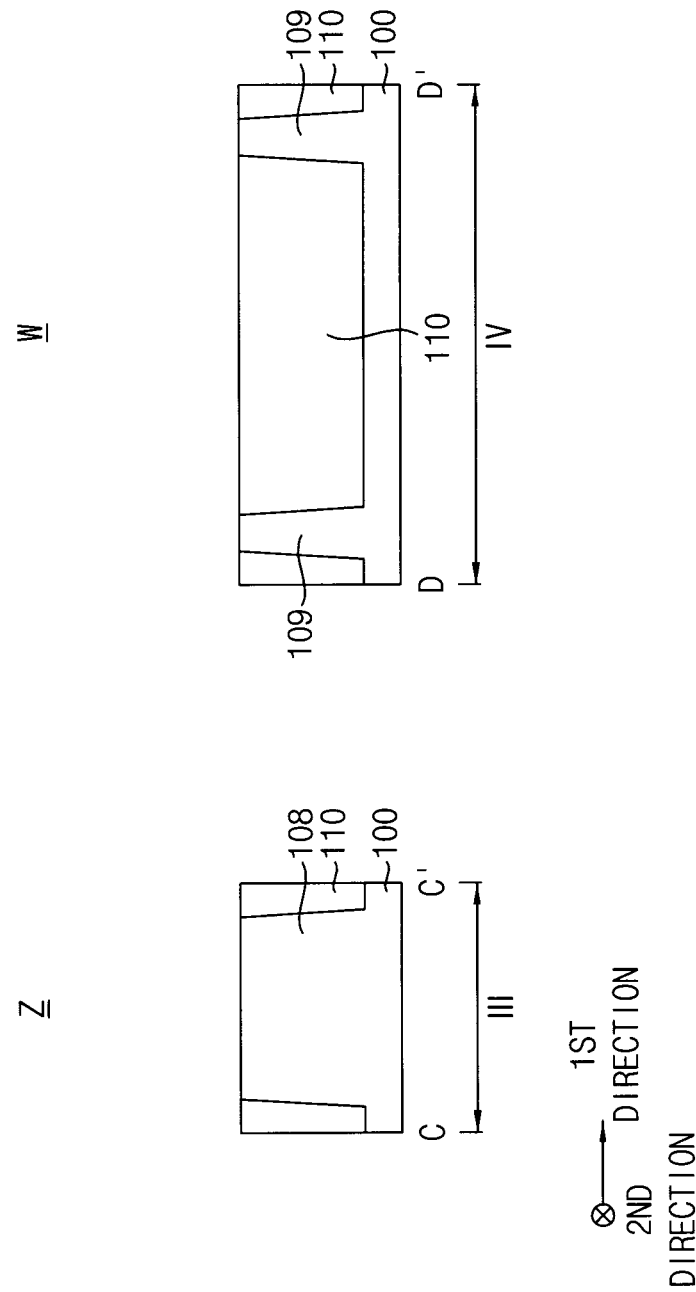

Referring to FIGS. 3 to 5, first to third active patterns 105, 108 and 109 may be formed on the second to fourth regions II, III and IV, respectively, of the substrate 100, and an isolation pattern 110 may be formed on the substrate 100 to cover sidewalls of the first to third active patterns 105, 108 and 109.

The first to third active patterns 105, 108 and 109 may be formed by removing an upper portion of the substrate 100 to form a first recess. A plurality of first active patterns 105 may be spaced apart from each other in the first and second directions. Each of the first active patterns 105 may extend in the third direction.

The isolation pattern 110 may be formed by forming an isolation layer on the substrate 100 to fill the first recess and planarizing the isolation layer until upper surfaces of the first to third active patterns 105, 108 and 109 may be exposed. In example embodiments, the planarization process may include a chemical mechanical polishing (CMP) process and/or an etch back process.

After an impurity region is formed in the substrate 100 by performing, e.g., an ion implantation process, the first active pattern 105 and the isolation pattern 110 on the second region II of the substrate 100 may be partially etched to form a second recess extending in the first direction.

A first gate structure 160 may be formed in the second recess. The first gate structure 160 may include a first gate insulation layer 130 on a surface of the first active pattern 105 exposed by the second recess, a first gate electrode 140 on the first gate insulation layer 130 to fill a lower portion of the second recess, and a first gate mask 150 on the first gate electrode 140 to fill an upper portion of the second recess. The first gate structure 160 may extend in the first direction, and a plurality of first gate structures 160 may be spaced apart from each other in the second direction.

The first gate insulation layer 130 may be formed by performing a thermal oxidation process on the surface of the first active pattern 105 exposed by the second recess, and thus may include, for example, silicon oxide.

Figure 6:
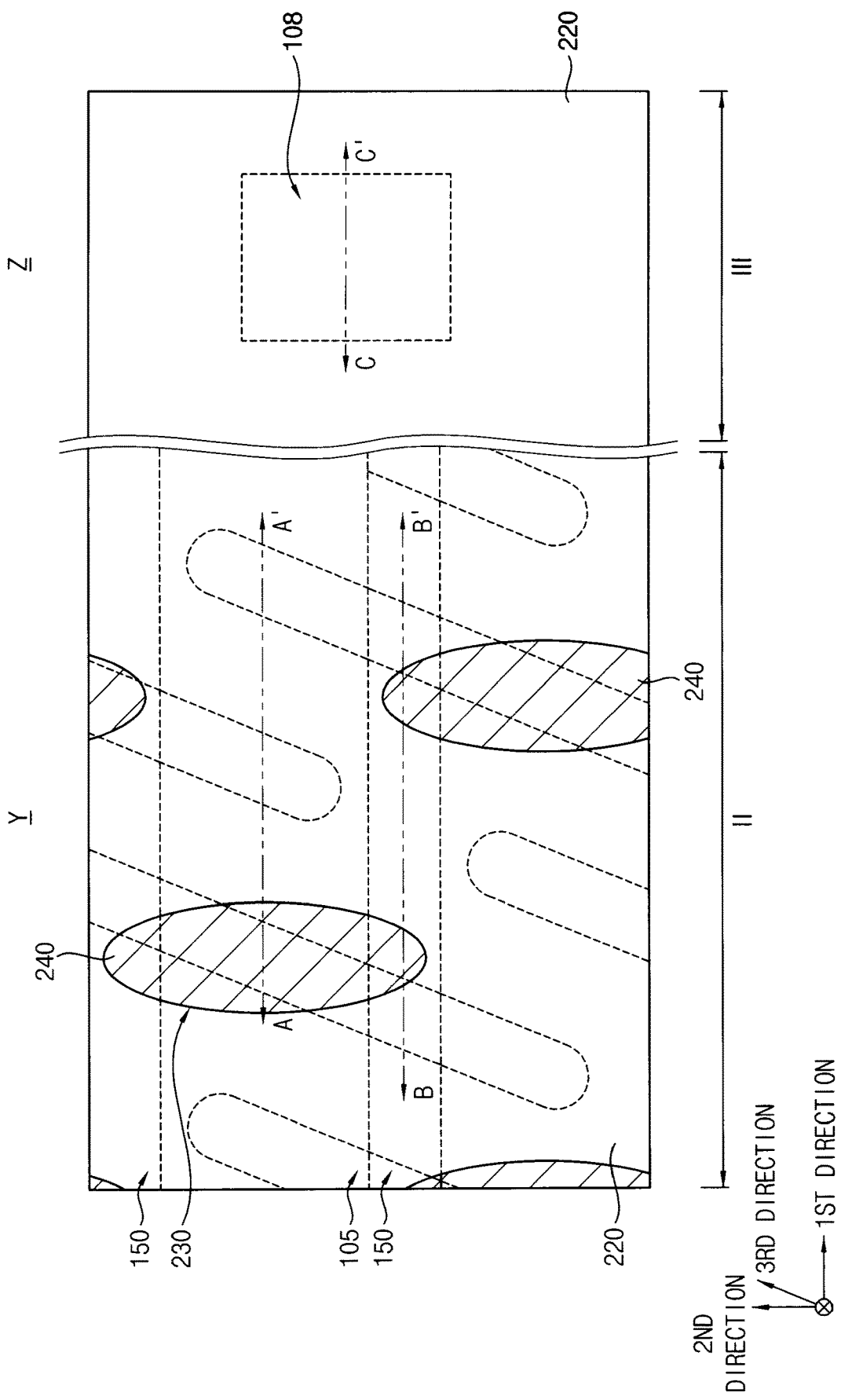
Figure 7:
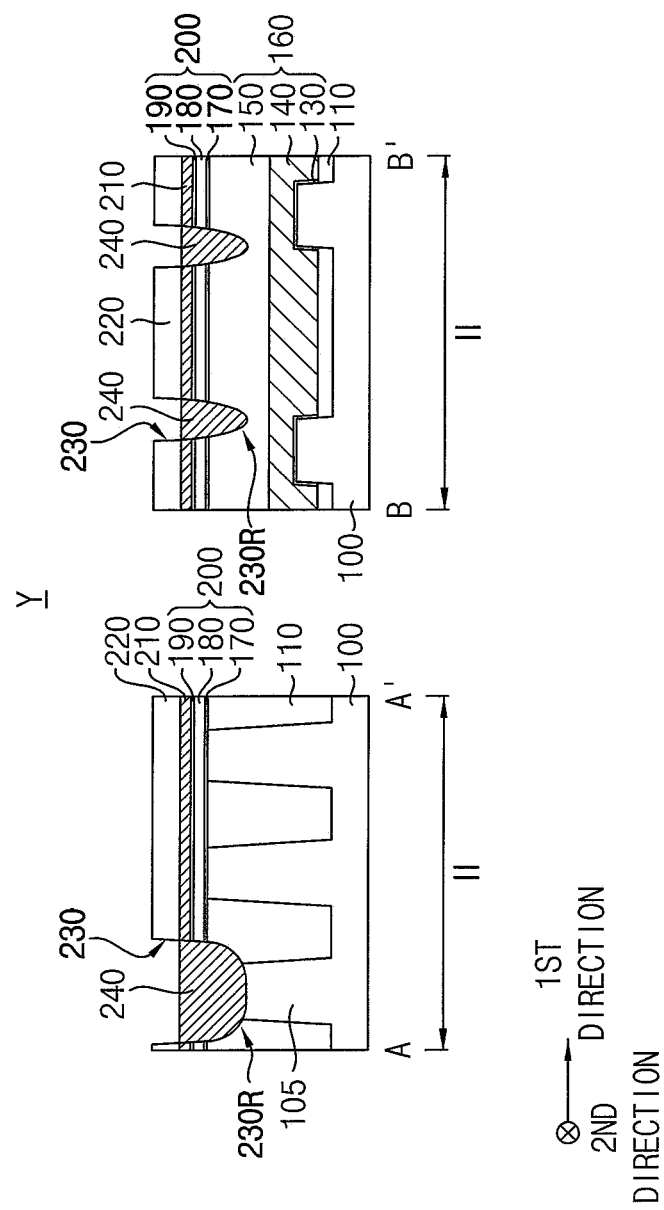
Figure 8:
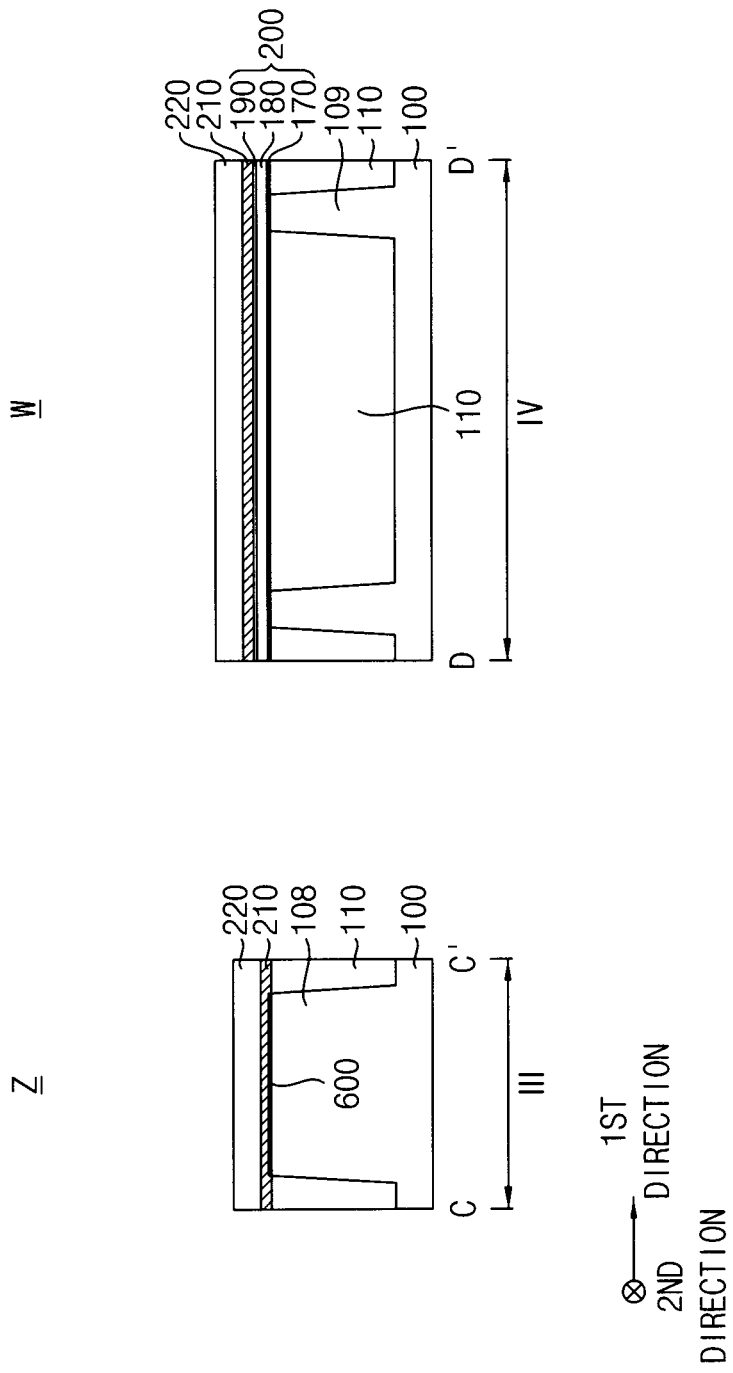

Referring to FIGS. 6 to 8, a thermal oxidation process may be performed on an upper surface of the second active pattern 108 on the third region III of the substrate 100 to form a second gate insulation layer 600, and an insulation layer structure 200 may be formed on the first and third active patterns 105 and 109 and the isolation pattern 110 on the second and fourth regions II and IV of the substrate 100.

In example embodiments, the insulation layer structure 200 may include first, second, and third insulation layers 170, 180, and 190 sequentially stacked. The first and third insulation layers 170 and 190 may include oxide, e.g., silicon oxide, and the second insulation layer 180 may include nitride, e.g., silicon nitride.

A first conductive layer 210 and a first mask 220 may be sequentially formed on the insulation layer structure 200. The first mask 220 may include a first opening 230. The second gate insulation layer 600 and the isolation pattern 110, and the first conductive layer 210 and the insulation layer structure 200 may be etched using the first mask 220 as an etching mask to form a third recess 230R exposing the first active pattern 105 on the second region II of the substrate 100.

The first conductive layer 210 may include, for example, polysilicon doped with impurities, and the first mask 220 may include nitride, e.g., silicon nitride.

During the etching process, upper portions of the first active pattern 105, the isolation pattern 110 and the first gate mask 150 exposed by the first opening 230 may also be etched to form the third recess 230R. For example, a bottom of the third recess 230R may be defined by a recessed surface of the first active pattern 105.

In example embodiments, the first opening 230 may expose an upper surface of a central portion of each of the first active patterns 105 extending in the third direction, and thus a plurality of third recesses 230R may be formed in the first and second directions on the second region II of the substrate 100.

A second conductive layer 240 may be formed to fill the third recess 230R.

In example embodiments, the second conductive layer 240 may be formed by forming a preliminary second conductive layer on the first active pattern 105, the isolation pattern 110, the first gate mask 150, and the first mask 220 to fill the third recess 230R, and removing an upper portion of the preliminary second conductive layer through a CMP process and/or an etch bask process. The second conductive layer 240 may have an upper surface substantially coplanar with an upper surface of the first conductive layer 210.

In example embodiments, a plurality of second conductive layers 240 may be spaced apart from each other in the first and second directions on the second region II of the substrate 100. The second conductive layer 240 may include, for example, doped polysilicon. In an example embodiment, the second conductive layer 240 may be merged with the first conductive layer 210.

Figure 9:
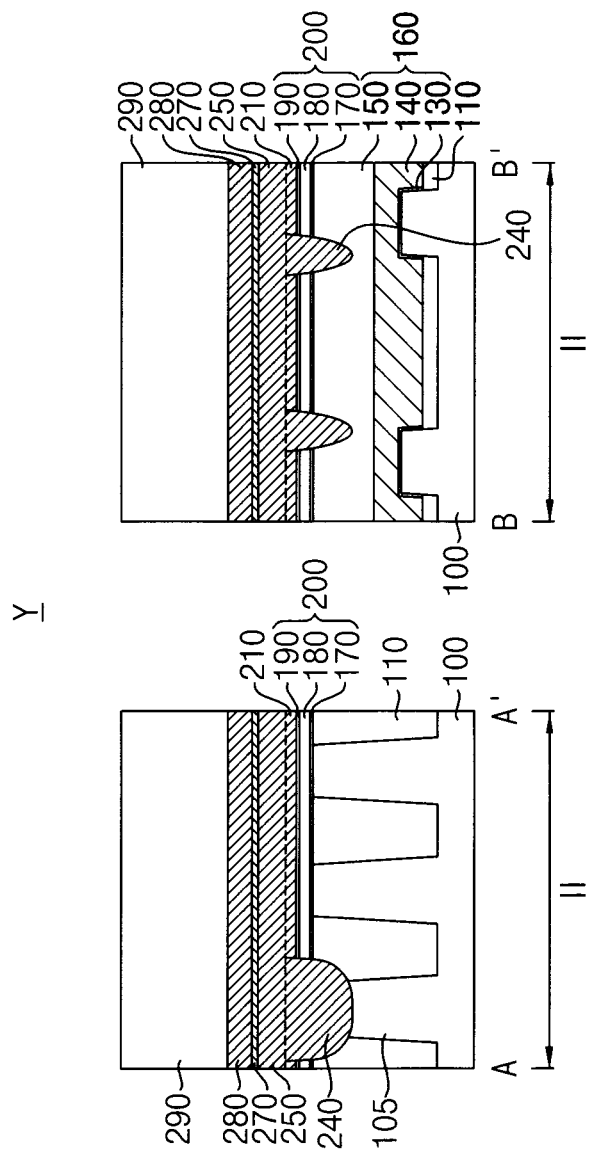
Figure 10:
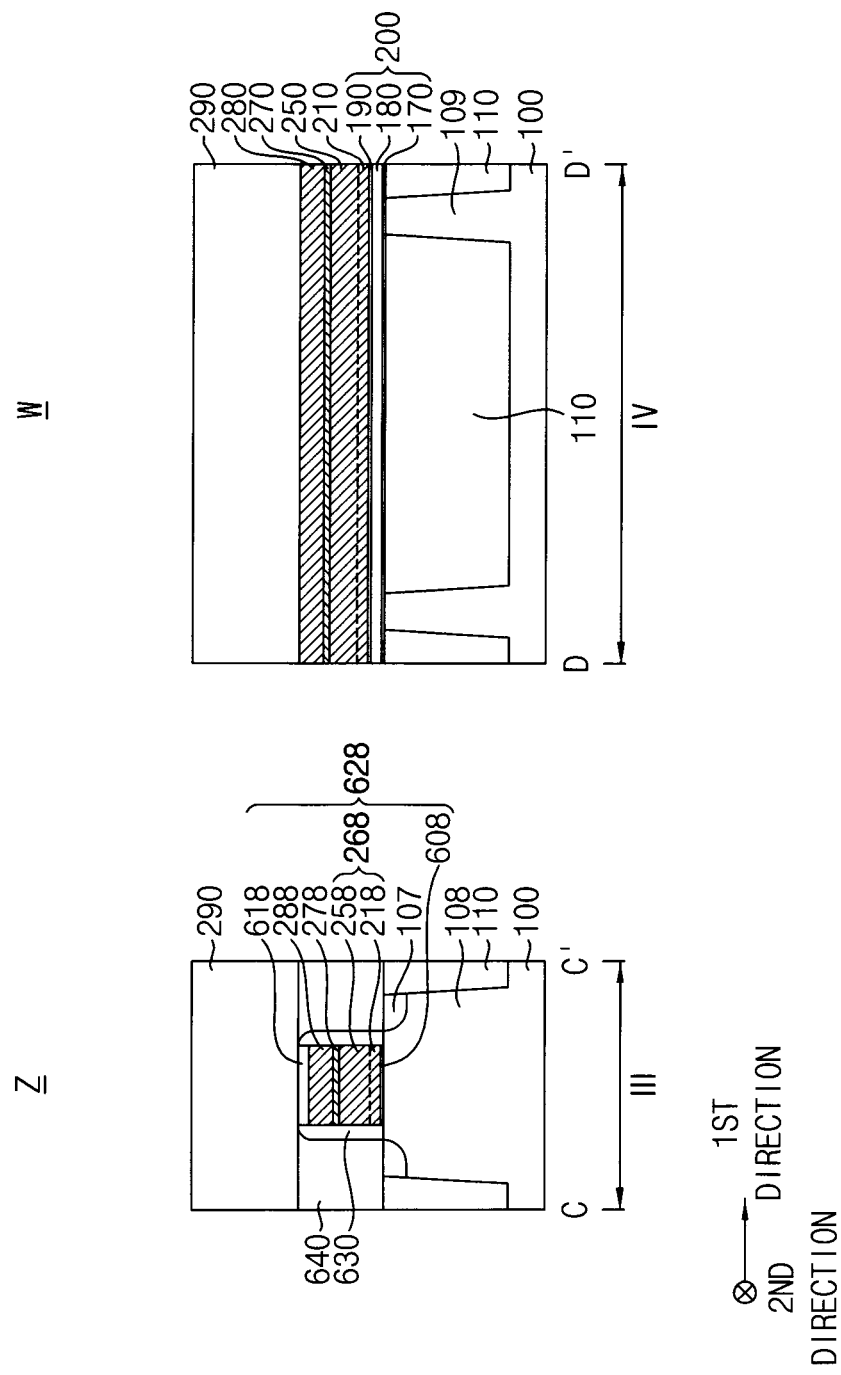

Referring to FIGS. 9 and 10, after removing the first mask 220, a third conductive layer 250, a barrier layer 270, and a first metal layer 280 may be sequentially formed on the first and second conductive layers 210 and 240.

In example embodiments, the third conductive layer 250 may include a material substantially the same as that of the first and second conductive layers 210 and 240. For example, the third conductive layer 250 may include doped polysilicon, and thus, in some embodiments, may be merged with the first and second conductive layers 210 and 240. The barrier layer 270 may include metal nitride, e.g., titanium nitride, tantalum nitride, tungsten nitride, etc. The first metal layer 280 may include metal, e.g., tungsten, titanium, tantalum, etc.

A second mask (not shown) may be formed to cover portions of the first metal layer 280 on the second and fourth regions II and IV of the substrate 100, and a second gate mask 618 may be formed to partially cover a portion of the first metal layer 280 on the third region III of the substrate 100. After forming the second mask and the second gate mask 618, the first metal layer 280, the barrier layer 270, the third conductive layer 250, the first conductive layer 210 and the second gate insulation layer 600 may be sequentially etched using the second mask and the second gate mask 618 as an etching mask.

Thus, a second gate structure 628 may be formed on the third region III of the substrate 100. The second gate structure 628 may include a second gate insulation pattern 608, a second conductive pattern 218, a sixth conductive pattern 258, a second barrier pattern 278, a second metal pattern 288 and the second gate mask 618 sequentially stacked on the second active pattern 108. The second and sixth conductive patterns 218 and 258 may include the same material, and thus may be merged with each other to form a second gate electrode 268.

A gate spacer 630 may be formed to cover a sidewall of the second gate structure 628, and impurities may be implanted into an upper portion of the second active pattern 108 adjacent to the second gate structure 628 to form a source/drain layer 107.

After removing the second mask, a first insulating interlayer may be formed on the second to fourth regions II, III and IV of the substrate 100, and may be planarized until the first metal layer 280 and the second gate mask 618 may be exposed to form a first insulating interlayer pattern 640 surrounding the second gate structure 628 and the gate spacer 630 on the third region III of the substrate 100. The first insulating interlayer pattern 640 may include an oxide, e.g., silicon oxide.

A capping layer 290 may be formed on the first metal layer 280, the first insulating interlayer pattern 640 and the second gate mask 618. The capping layer 290 may include nitride, e.g., silicon nitride.

Figure 11:
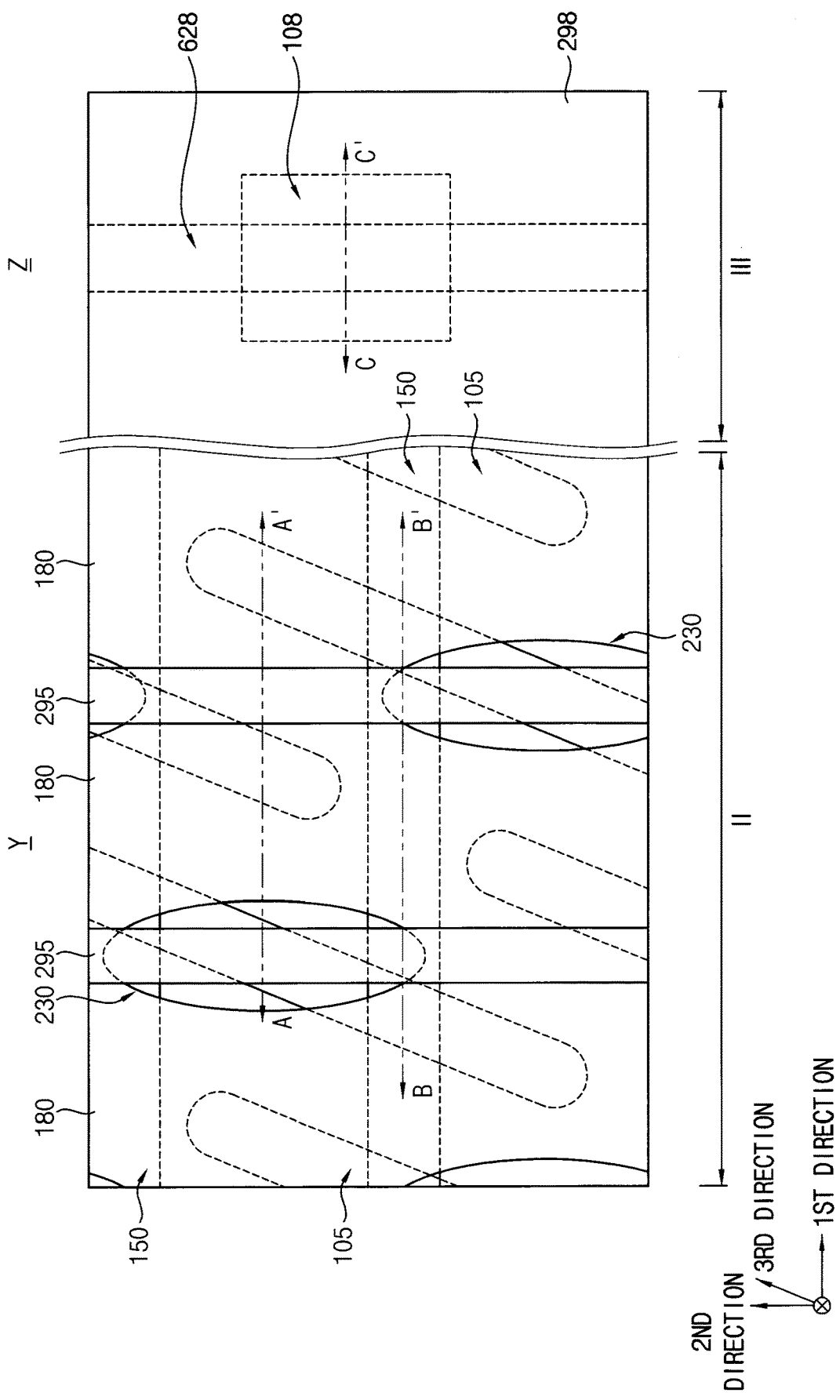
Figure 12:
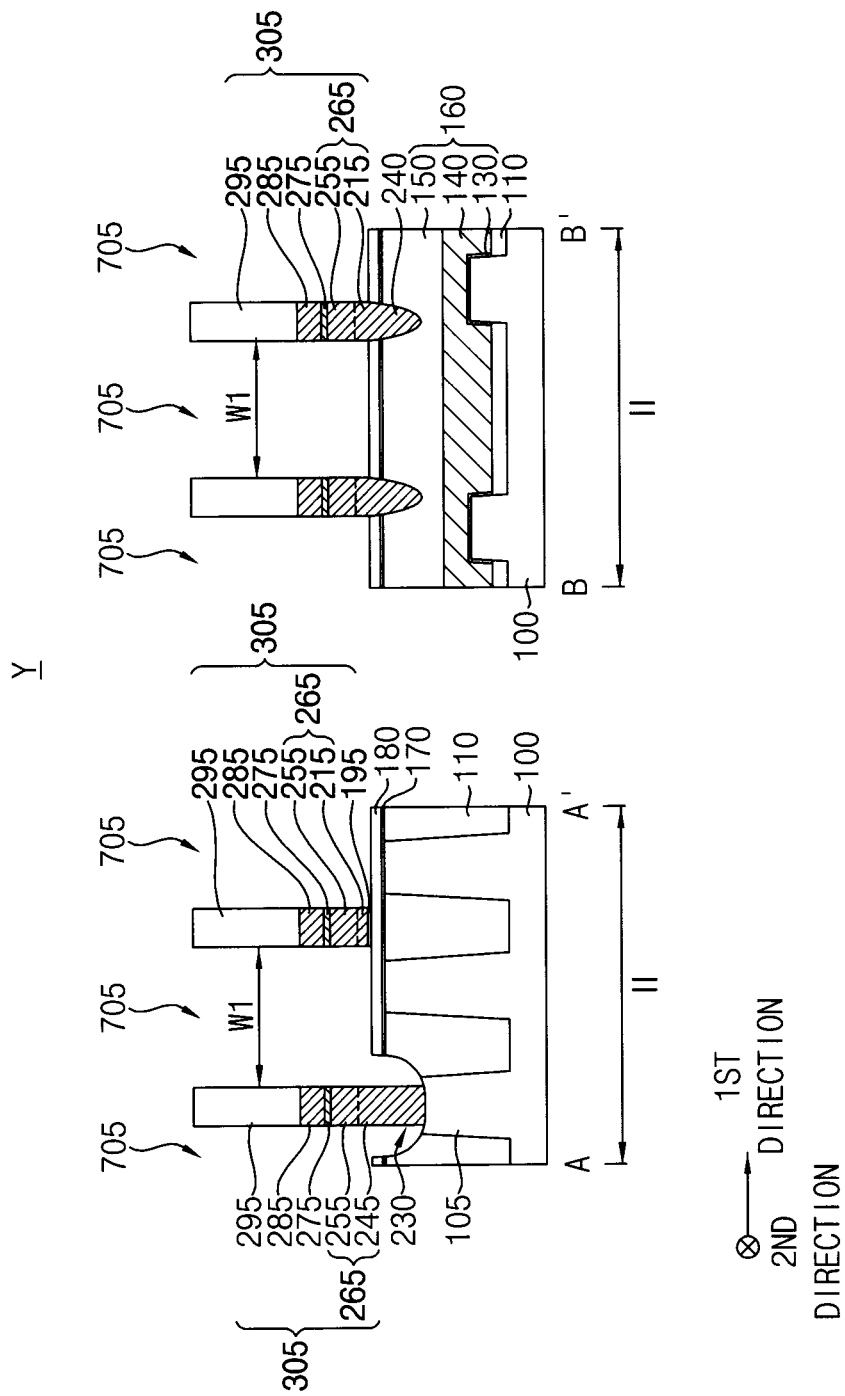
Figure 13:
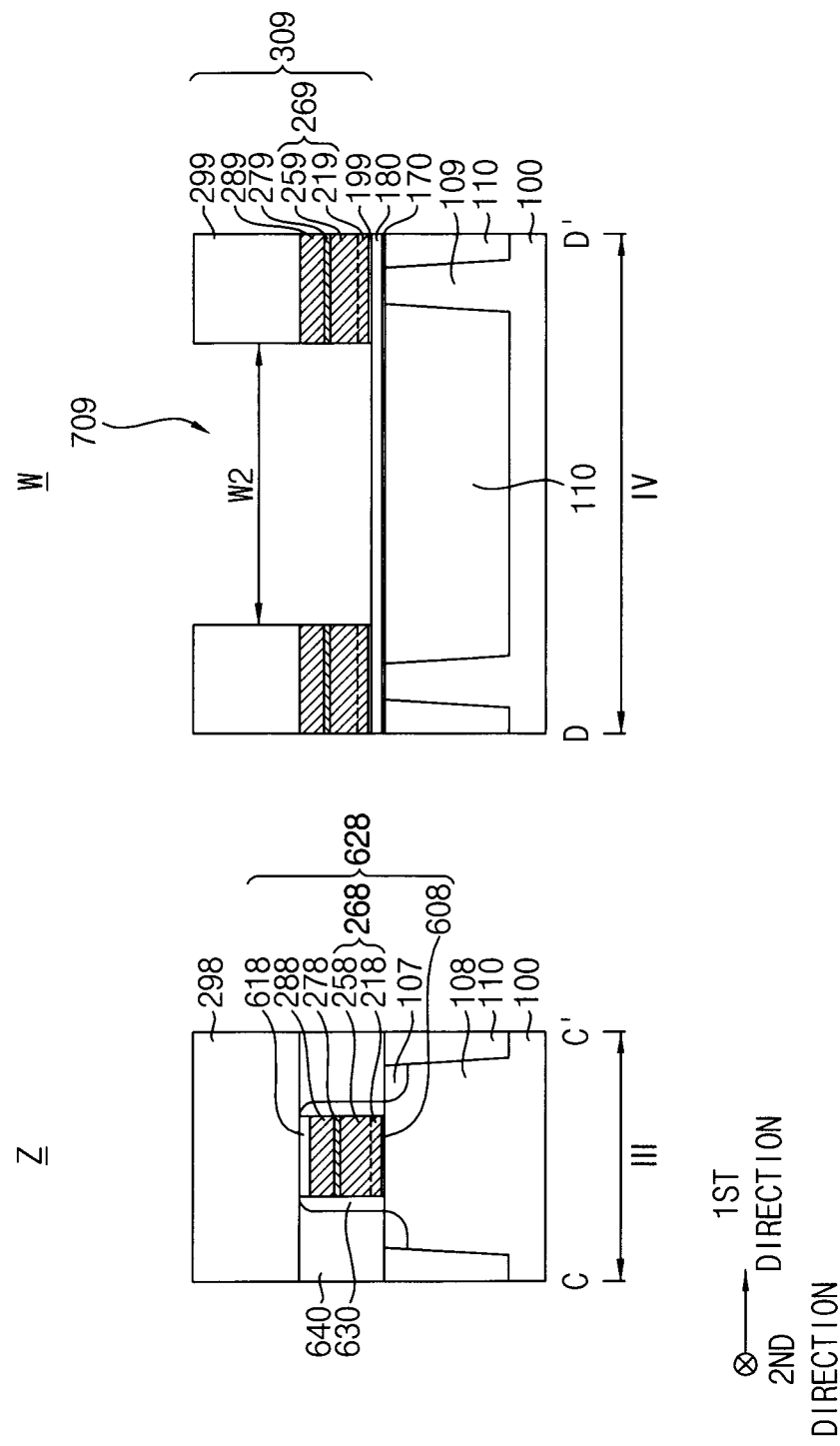

Referring to FIGS. 11 to 13, a portion of the capping layer 290 on the second and fourth regions II and IV of the substrate 100 may be etched to form first and third capping patterns 295 and 299, respectively, and the first metal layer 280, the barrier layer 270, the third conductive layer 250, the first and second conductive layers 210 and 240, and the third insulation layer 190 may be sequentially etched using the first and third capping patterns 295 and 299 as an etching mask.

In example embodiments, the first capping pattern 295 may extend in the second direction, and a plurality of first capping patterns 295 may be spaced apart from each other in the first direction on the second region II of the substrate 100. Additionally, the third capping pattern 299 may extend in the second direction, and a plurality of third capping patterns 299 may be spaced apart from each other in the first direction on the fourth region IV of the substrate 100. A portion of the capping layer 290 on the third region III of the substrate 100 may remain as a second capping pattern 298.

By the etching process, on the second region II of the substrate 100, a fourth conductive pattern 245, a fifth conductive pattern 255, a first barrier pattern 275, a first metal pattern 285, and the first capping pattern 295 may be sequentially stacked on the first active pattern 105, the isolation pattern 110 and the first gate mask 150 in the third recess 230R, and a third insulation pattern 195, a first conductive pattern 215, the fifth conductive pattern 255, the first barrier pattern 275, the first metal pattern 285, and the first capping pattern 295 may be sequentially stacked on the second insulation layer 180 of the insulation layer structure 200 at an outside of the third recess 230R.

As illustrated above, the first to third conductive layers 210, 240 and 250 may be merged with each other, and thus the fourth and fifth conductive patterns 245 and 255 sequentially stacked and the first and fifth conductive patterns 215 and 255 sequentially stacked may each form a first conductive structure 265. Hereinafter, the first conductive structure 265, the first barrier pattern 275, the first metal pattern 285, and the first capping pattern 295 sequentially stacked may be referred to as a bit line structure 305.

In example embodiments, the bit line structure 305 may extend in the second direction on the second region II of the substrate 100, and a plurality of bit line structures 305 may be spaced apart from each other in the first direction.

On the fourth region IV of the substrate 100, a sixth insulation pattern 199, a third conductive pattern 219, a seventh conductive pattern 259, a third barrier pattern 279, a third metal pattern 289 and a third capping pattern 299 may be sequentially stacked on the second insulation layer 180 of the insulation layer structure 200. The third and seventh conductive patterns 219 and 259 sequentially stacked may form a second conductive structure 269. Hereinafter, the sixth insulation pattern 199, the second conductive structure 269, the third barrier pattern 279, the third metal pattern 289 and the third capping pattern 299 sequentially stacked may be referred to as a key structure 309.

In example embodiments, the key structure 309 may extend in the second direction on the fourth region IV of the substrate 100, and a plurality of key structures 309 may be spaced apart from each other in the first direction. An upper surface of the key structure 309 may be substantially coplanar with an upper surface of the bit line structure 305. In an exemplary embodiment, the key structure 309 and the bit line structure 305 may be formed, using a same process, from a stack of the first metal layer 280, the barrier layer 270, the third conductive layer 250, the first conductive layer 210 (or merged with the second conductive layer 240).

A first trench 705 may be formed between neighboring ones of the bit line structures 305 on the second region II of the substrate 100 to extend in the second direction, and may expose an upper surface of the second insulation layer 180 to be connected with the third recess 230R. The first trench 705 may have a first width W1 in the first direction. Additionally, a second trench 709 may be formed between neighboring ones of the key structures 309 on the fourth region IV of the substrate 100 to extend in the second direction. The second trench 709 may expose an upper surface of the second insulation layer 180, and may have a second width W2 greater than the first width W1 in the first direction. For example, a distance between the key structures 309 spaced apart from each other in the first direction may be greater than a distance between the bit line structures 305 spaced apart from each other in the first direction. In example embodiments, the second trench 709 may have a vertical sidewall substantially perpendicular to the upper surface of the substrate 100.

Figure 14:
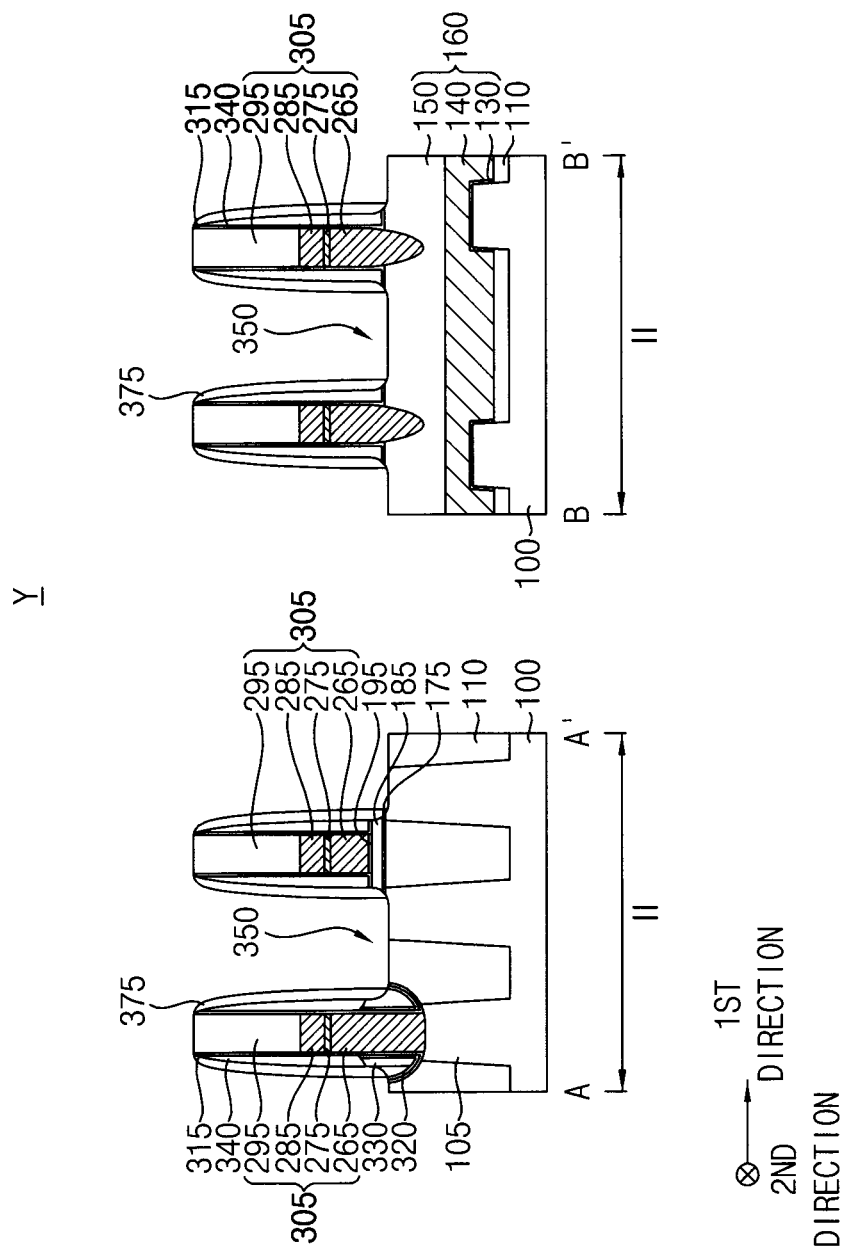
Figure 15:
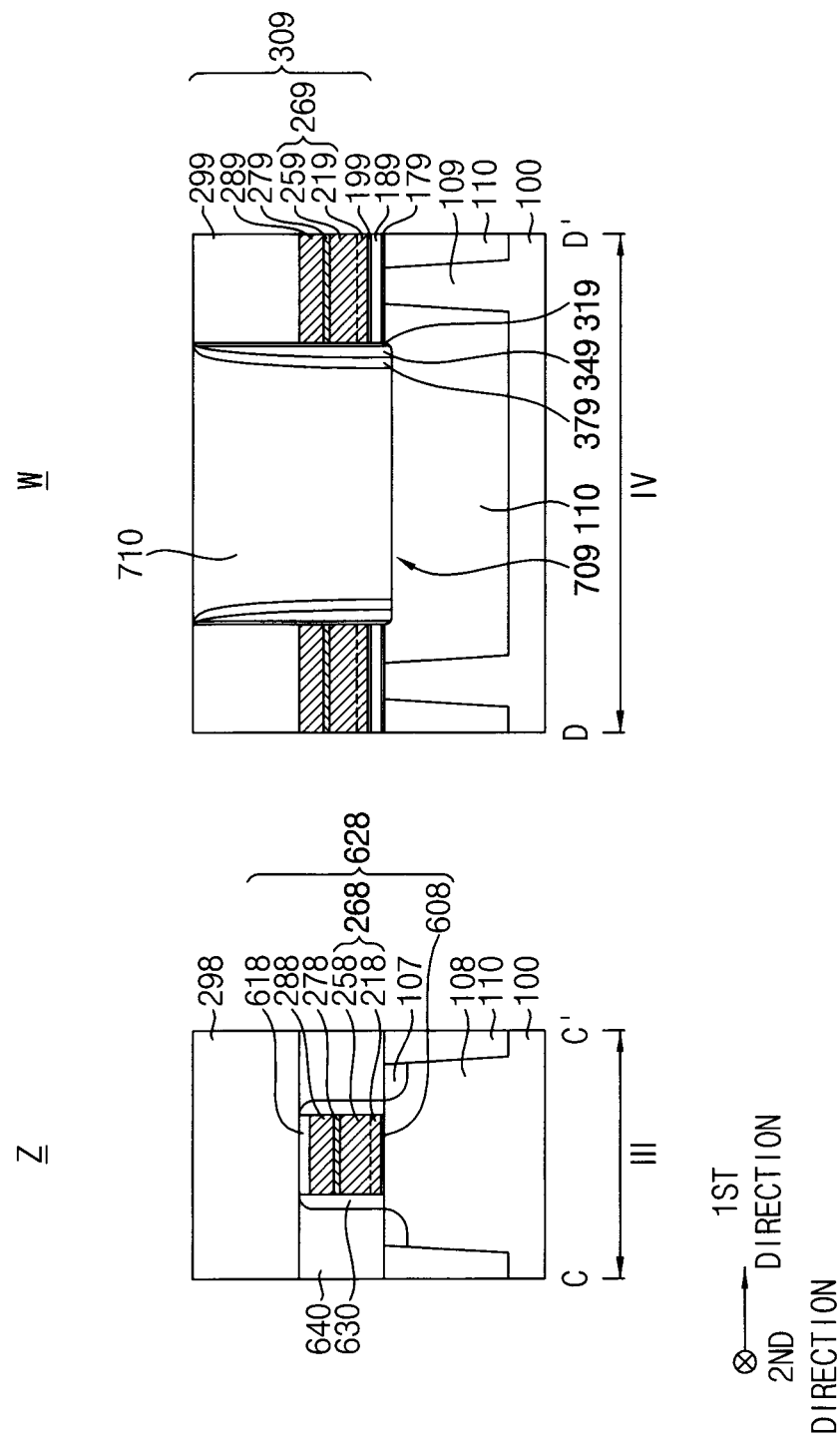

Referring to FIGS. 14 and 15, a first spacer layer may be formed on upper surfaces of the first active pattern 105, the isolation pattern 110 and the first gate mask 150 exposed by the third recess 230R, a sidewall of the third recess 230R, the second insulation layer 180, and the second and third capping patterns 298 and 299 to cover the bit line structure 305 and the key structure 309, and fourth and fifth insulation layers may be sequentially formed on the first spacer layer.

The first spacer layer may also cover a sidewall of the third insulation pattern 195 between the second insulation layer 180 and the bit line structure 305, and the fifth insulation layer may fill the third recess 230R.

The fourth and fifth insulation layers may be etched by an etching process. In example embodiments, the etching process may be performed by a wet etch process, and other portions of the fourth and fifth insulation layers except for a portion in the third recess 230R may be removed. Thus, most of an entire surface of the first spacer layer, for example, an entire surface except for a portion thereof in the third recess 230R may be exposed, and portions of the fourth and fifth insulation layers remaining in the third recess 230R may form seventh and eighth insulation patterns 320 and 330, respectively.

A second spacer layer may be formed on the exposed surface of the first spacer layer and the seventh and eighth insulation patterns 320 and 330 in the third recess 230R, and may be anisotropically etched to form third and fourth spacers 340 and 349 on the surface of the first spacer layer and the seventh and eighth insulation patterns 320 and 330 to cover a sidewall of the bit line structure 305 and a sidewall of the key structure 309, respectively. The third and fourth spacers 340 and 349 may include an oxide, e.g., silicon oxide.

A dry etching process may be performed using the first to third capping patterns 295, 298 and 299 and the third and fourth spacers 340 and 349 as an etching mask to form a third trench 350 exposing the upper surface of the first active pattern 105 on the second region II of the substrate 100. In an example embodiment, the dry etching process may be a part of an etching process of forming the third and fourth spacers 340 and 349. The upper surface of the isolation pattern 110 and the upper surface of the first gate mask 150 may also be exposed by the third trench 350. Additionally, by the dry etching process, the second trench 709 may be enlarged downwardly to expose an upper surface of the isolation pattern 110 on the fourth region IV of the substrate 100.

By the dry etching process, portions of the first spacer layer on upper surfaces of the first to third capping patterns 295, 298 and 299 and an upper surface of the second insulation layer 180 may be removed, and thus a first spacer 315 covering the sidewall of the bit line structure 305 and a second spacer 319 covering the sidewall of the key structure 309 may be formed. The first and second spacers 315 and 319 may include nitride, e.g., silicon nitride. Additionally, during the dry etching process, the first and second insulation layers 170 and 180 may be partially removed, such that first and second insulation patterns 175 and 185 may remain under the bit line structure 305, and fourth and fifth insulation patterns 179 and 189 may remain under the key structure 309. The first to third insulation patterns 175, 185 and 195 that are sequentially stacked under the bit line structure 305 may form a first insulation pattern structure, and fourth to sixth insulation patterns 179, 189 and 199 that are sequentially stacked under the key structure 309 may form a second insulation pattern structure.

A third spacer layer may be formed on the upper surfaces of the first to third capping patterns 295, 298 and 299, outer sidewalls of the third and fourth spacers 340 and 349, portions of upper surfaces of the seventh and eighth insulation patterns 320 and 330, and the upper surfaces of the first active pattern 105, the isolation pattern 110 and the first gate mask 150 exposed by the third trench 350, and may be anisotropically etched to form a fifth spacer 375 covering the sidewall of the bit line structure 305 and a sixth spacer 379 covering the sidewall of the key structure 309. The fifth and sixth spacers 375 and 379 may include nitride, e.g., silicon nitride.

The first, third and fifth spacers 315, 340 and 375 sequentially stacked in a horizontal direction substantially parallel to the upper surface of the substrate 100 from the sidewall of the bit line structure 305 on the second region II of the substrate 100 may be referred to as a first preliminary spacer structure, and the second, fourth and sixth spacers 319, 349 and 379 sequentially stacked in the horizontal direction from the sidewall of the key structure 309 on the fourth region IV of the substrate 100 may be referred to as a second spacer structure.

A second insulating interlayer may be formed on the substrate 100 to cover the bit line structure 305, the key structure 309, the second capping pattern 298, the first preliminary spacer structure and the second spacer structure, and an upper portion of the second insulating interlayer may be planarized until the upper surfaces of the first to third capping patterns 295, 298 and 299 may be exposed, and an upper portion of the second insulating interlayer in the third recess 230R and the first trench 705 on the second region II of the substrate 100 may be removed to form a second insulating interlayer pattern 710 filling the second trench 709 on the fourth region IV of the substrate 100. The second insulating interlayer pattern 710 may include oxide, e.g., silicon oxide.

Figure 16:
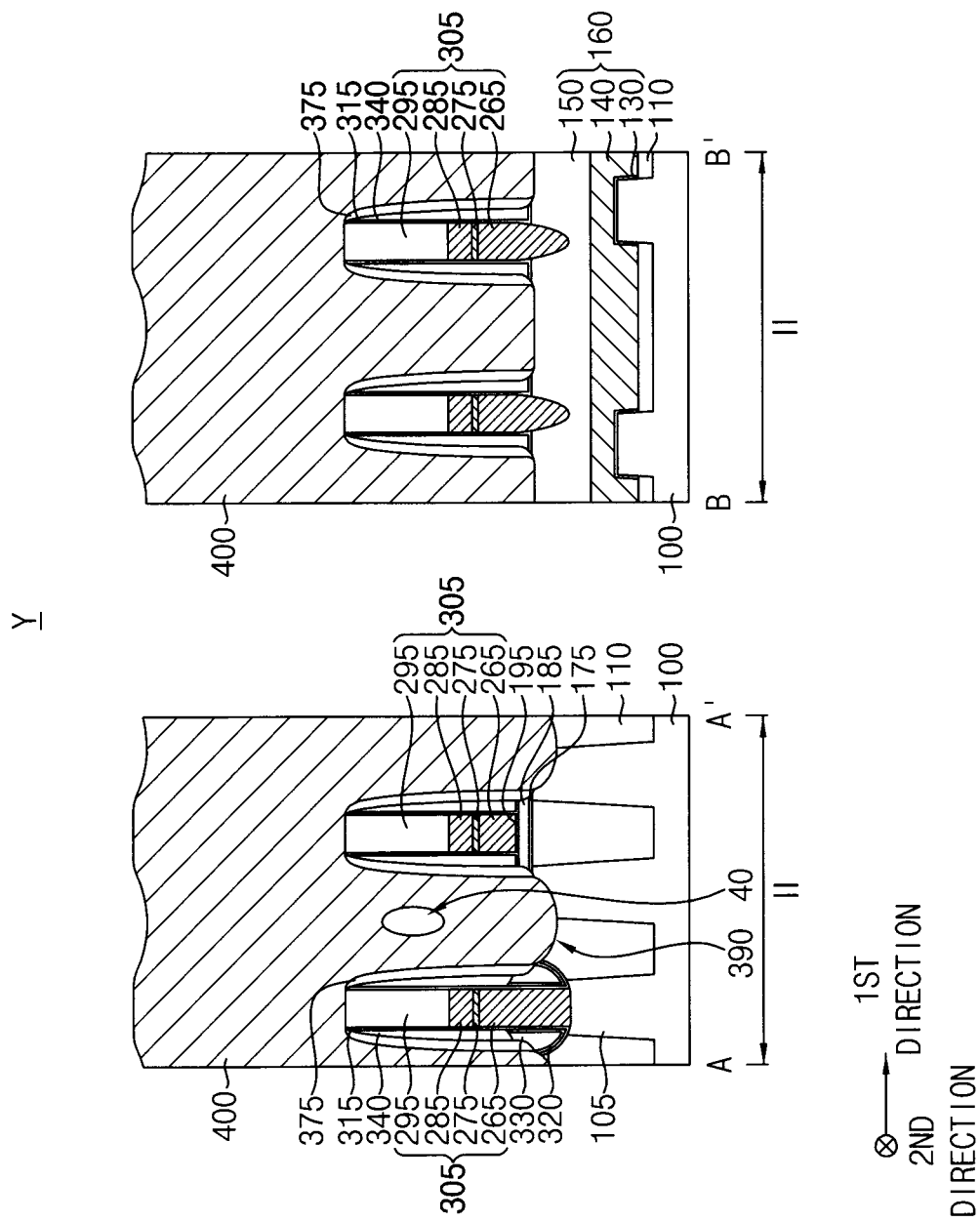
Figure 17:
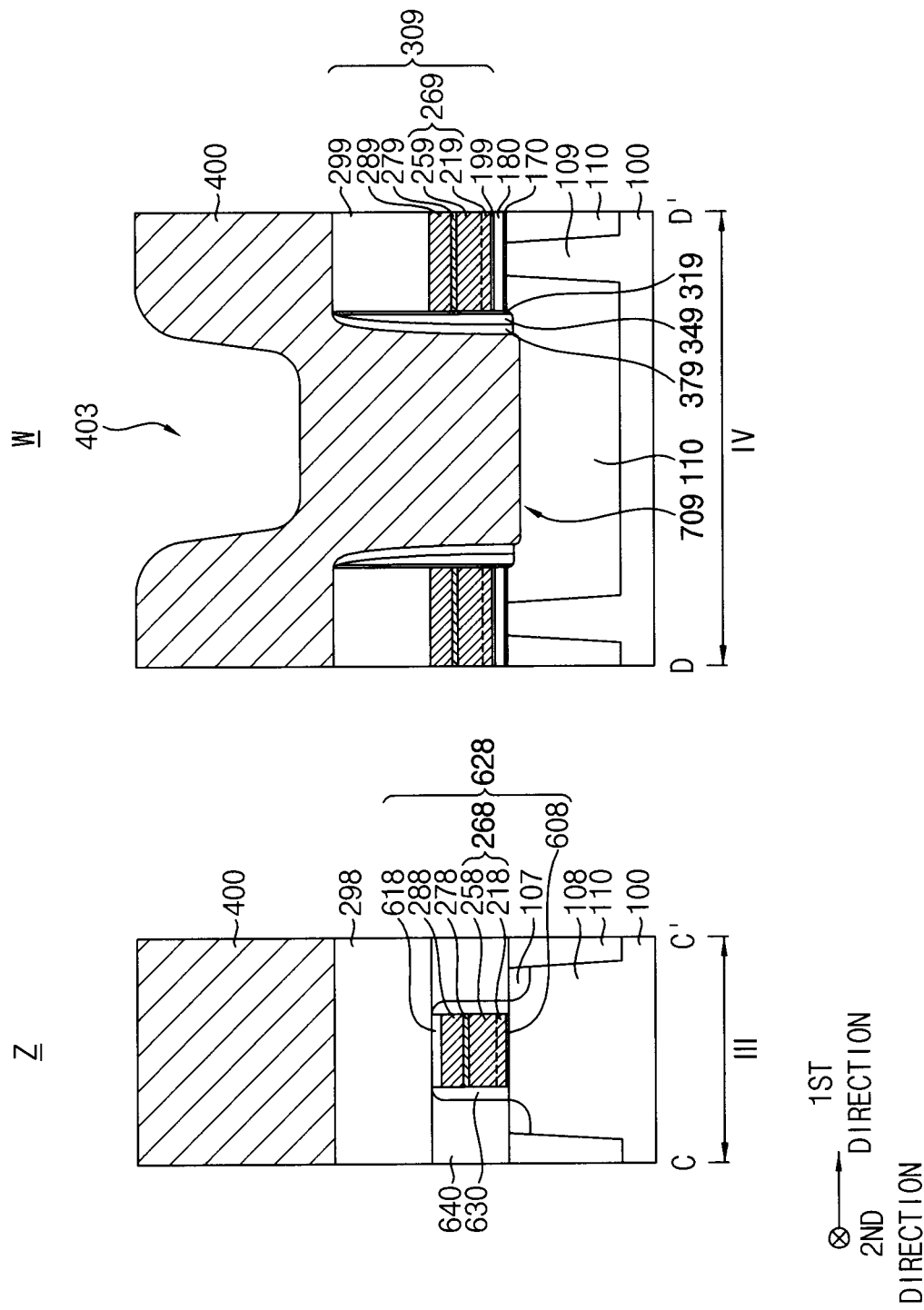

Referring to FIGS. 16 and 17, an upper portion of the first active pattern 105 may be removed by an etching process to form a fourth recess 390 connected to the third trench 350.

The second insulating interlayer pattern 710 on the fourth region IV of the substrate 100 may be removed to form the second trench 709 again, and an upper portion of the isolation pattern 110 under the second insulating interlayer pattern 710 may be partially etched. Thus, a bottom of the second trench 709 may be lower than that of each of the key structures 309 and may also be lower than an upper surface of the third active pattern 109.

A lower contact plug layer 400 may be formed to fill the third trench 350 and the fourth recess 390 on the second region II of the substrate 100 and the second trench 709 on the fourth region IV of the substrate 100.

The bit line structures 305 having the first preliminary spacer structures on the respective sidewalls thereof may be spaced apart from each other in the first direction on the second region II of the substrate 100, and the key structures 309 having the second spacer structures on the respective sidewalls thereof may be spaced apart from each other in the first direction on the fourth region IV of the substrate 100. Thus, the lower contact plug layer 400 may have an uneven upper surface.

Particularly, a width in the first direction of the third trench 350 may be less than the first width W1 in the first direction of the first trench 705 (refer to FIG. 12), and thus may be much less than the second width W2 in the first direction of the second trench 709. Accordingly, the lower contact plug layer 400 may not entirely fill the third trench 350 on the second region II of the substrate 100 to form a first air gap 40. An upper surface of a portion of the lower contact plug layer 400 on the second trench 709 may be much lower than an upper surface of a portion of the lower contact plug layer 400 on the key structure 309 on the fourth region IV of the substrate 100.

In example embodiments, the lower contact plug layer 400 may include a conductive material, e.g., doped polysilicon.

Figure 18:
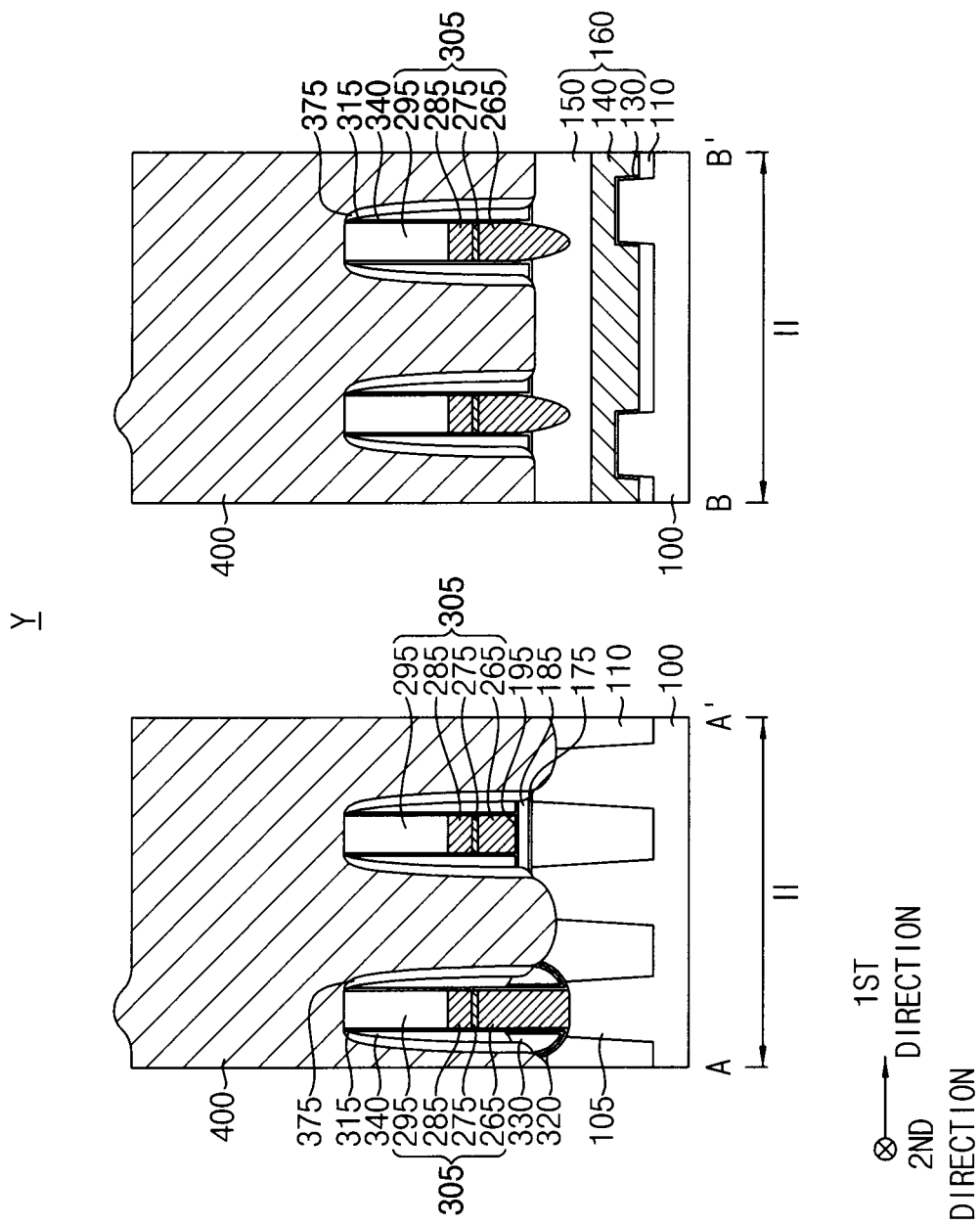
Figure 19:
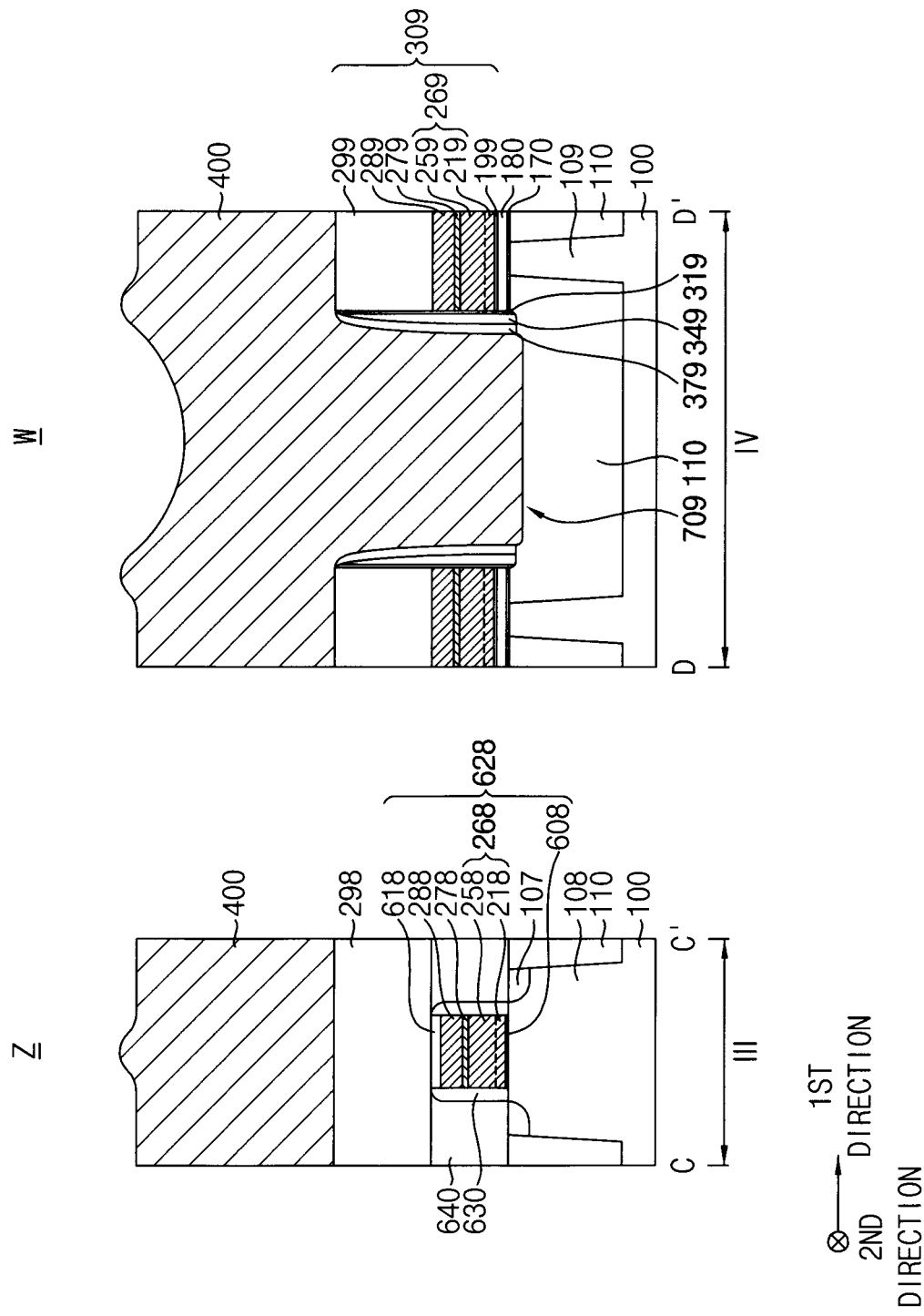

Referring to FIGS. 18 and 19, a melting process may be performed on the lower contact plug layer 400.

In example embodiments, the melting process may include a laser annealing process.

In the laser annealing process, the lower contact plug layer 400 may be heated such that the heated lower contact plug layer 400 flows to annihilate the first air gap 40 between the bit line structures 305, and the uneven upper surface of the lower contact plug layer 400 may be considerably planarized. In an example embodiment, the height difference between the upper surface of the portion of the lower contact plug layer 400 on the second trench 709 and the upper surface of the portion of the lower contact plug layer 400 on the key structure 309 may be relieved on the fourth region IV of the substrate 100.

In an example embodiment, the melting process may cause the upper surface of the lower contact plug layer 400 to have a wave-like shape.

Figure 20:
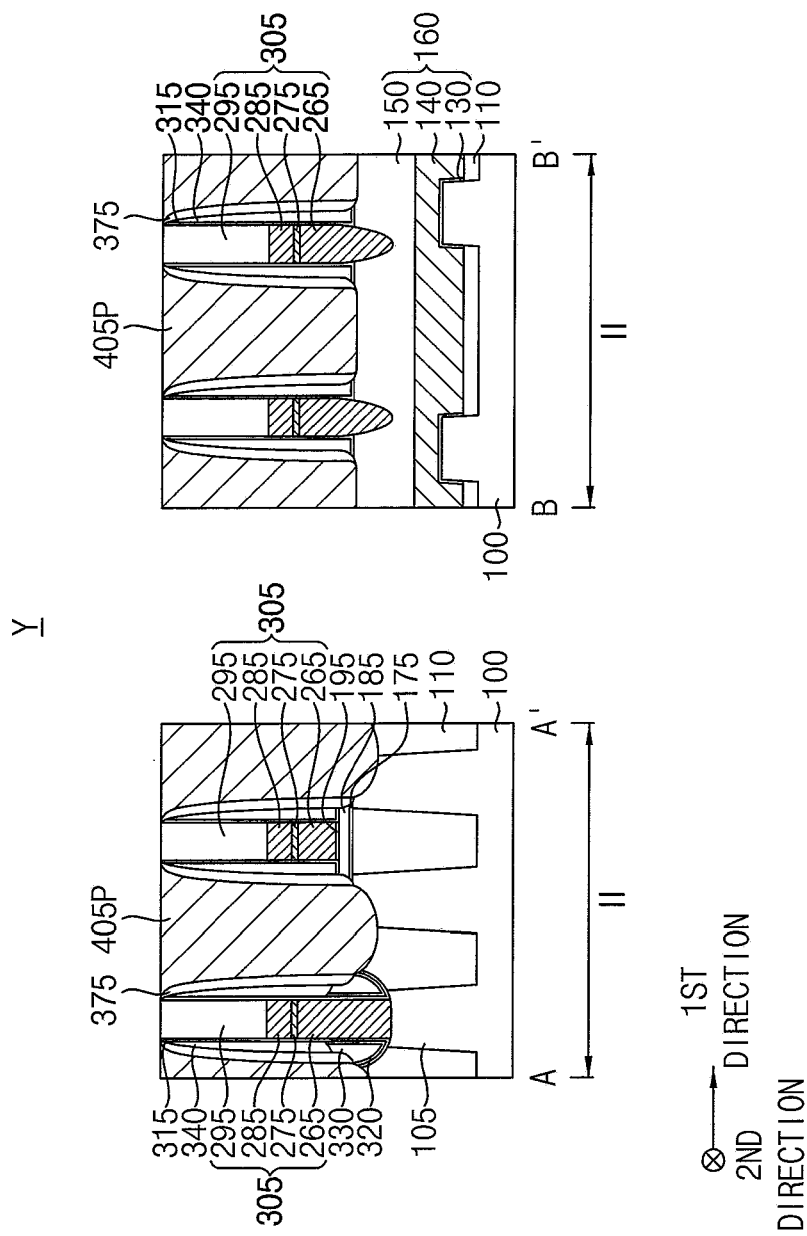
Figure 21:
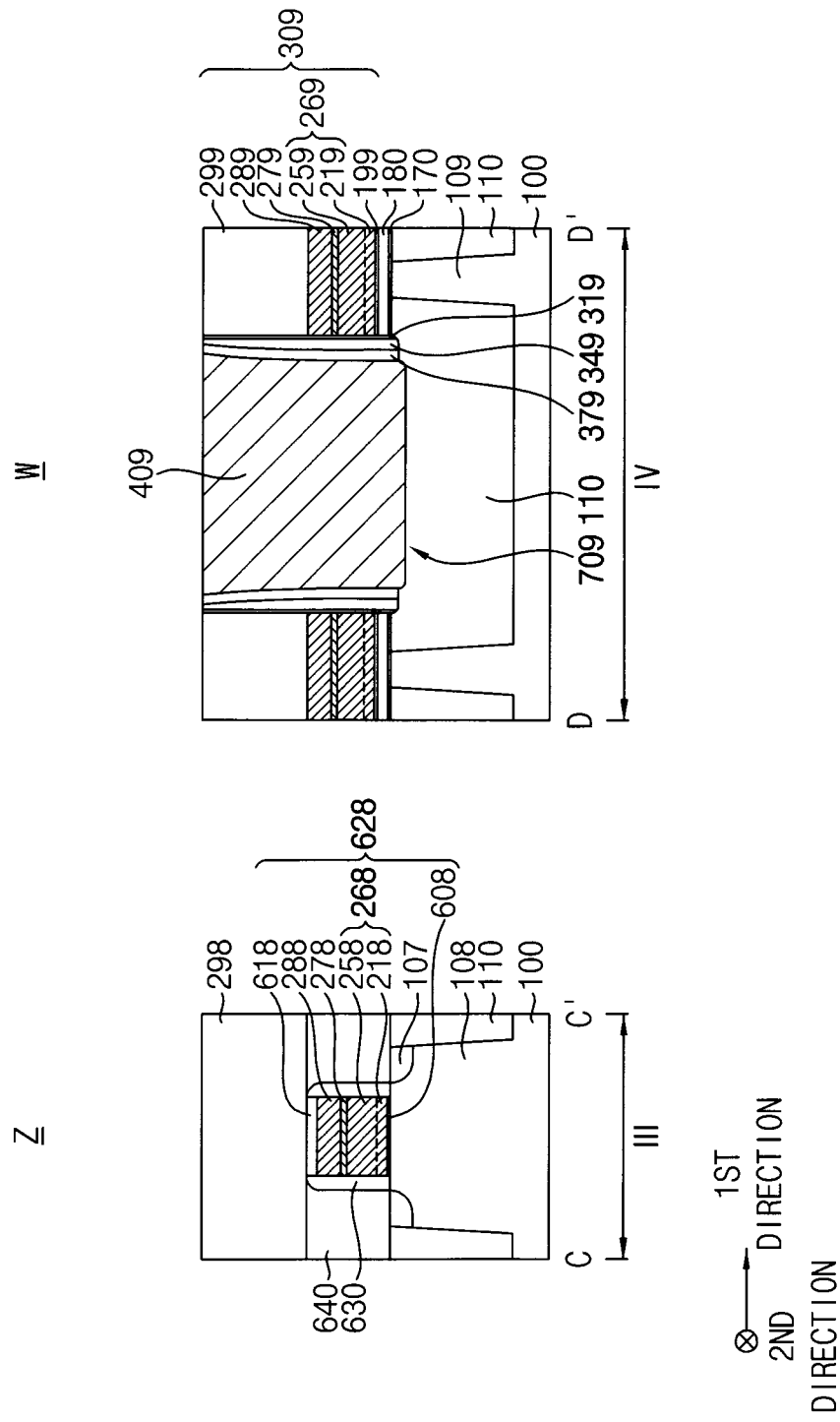

Referring to FIGS. 20 and 21, an upper portion of the lower contact plug layer 400 may be planarized until the upper surfaces of the first to third capping patterns 295, 298 and 299 may be exposed. Thus, a preliminary lower contact plug 405P may be formed between the bit line structures 305, and a filling pattern 409 may be formed between the key structures 309.

The planarization process may include a CMP process. As illustrated above, since the height difference between the upper surfaces of portions of the lower contact plug layer 400 has been relieved, each of the preliminary lower contact plug 405P and the filling pattern 409 may have a flat upper surface. The upper surface of the preliminary lower contact plug 405P between the bit line structures 305 may be substantially coplanar with the upper surfaces of the bit line structures 305, and the upper surface of the filling pattern 409 between the key structures 309 may be substantially coplanar with the upper surfaces of the key structures 309. Accordingly, since the upper surfaces of the bit line structures 305 and the upper surfaces of the key structures 309 have the substantially the same height, the upper surface of the preliminary lower contact plug 405P and the upper surface of the filling pattern 409 may have substantially the same height.

In example embodiments, each of the preliminary lower contact plug 405P and the filling pattern 409 may extend in the second direction, and a plurality of preliminary lower contact plugs 405P may be formed to be spaced apart from each other in the first direction.

Figure 22:
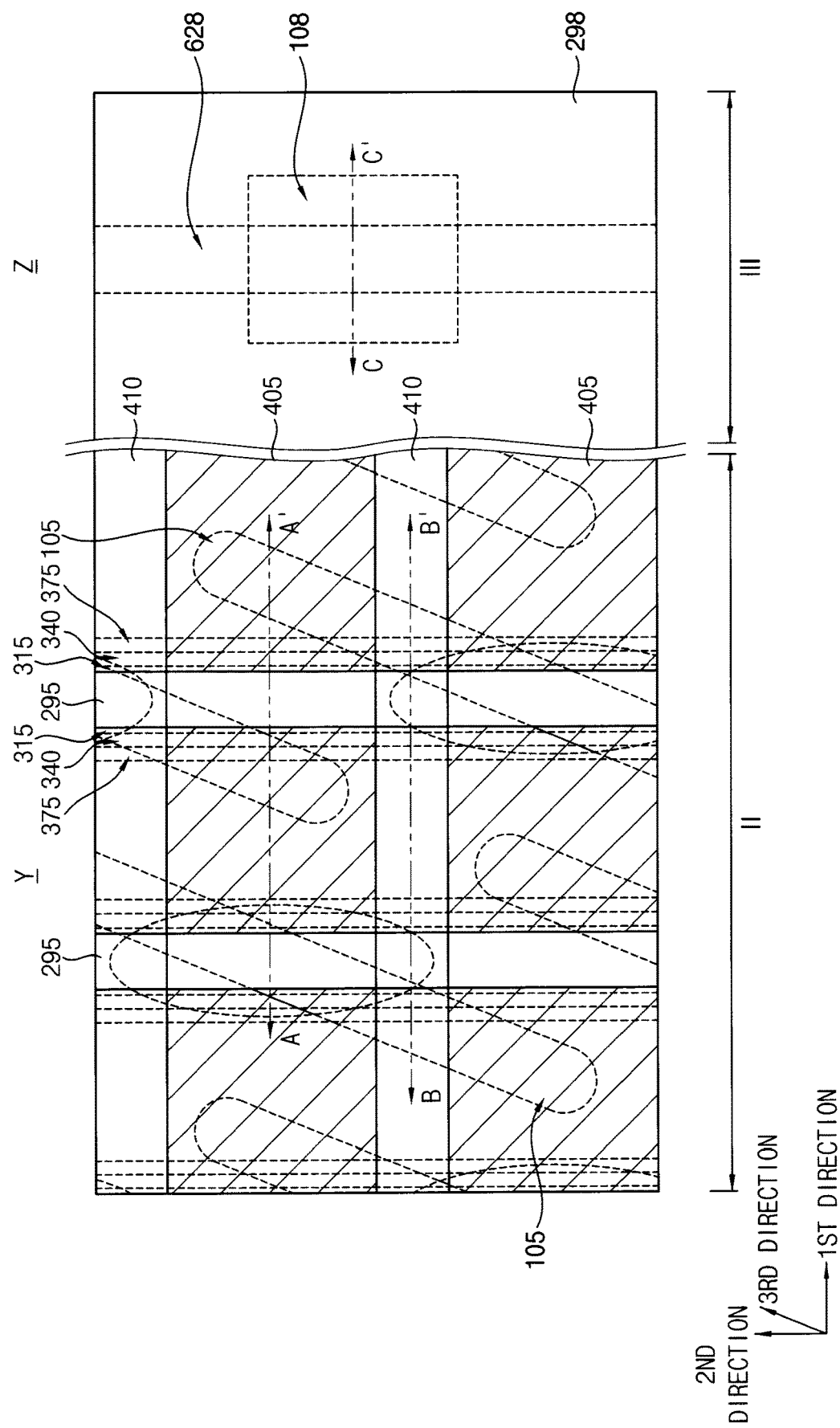
Figure 23:
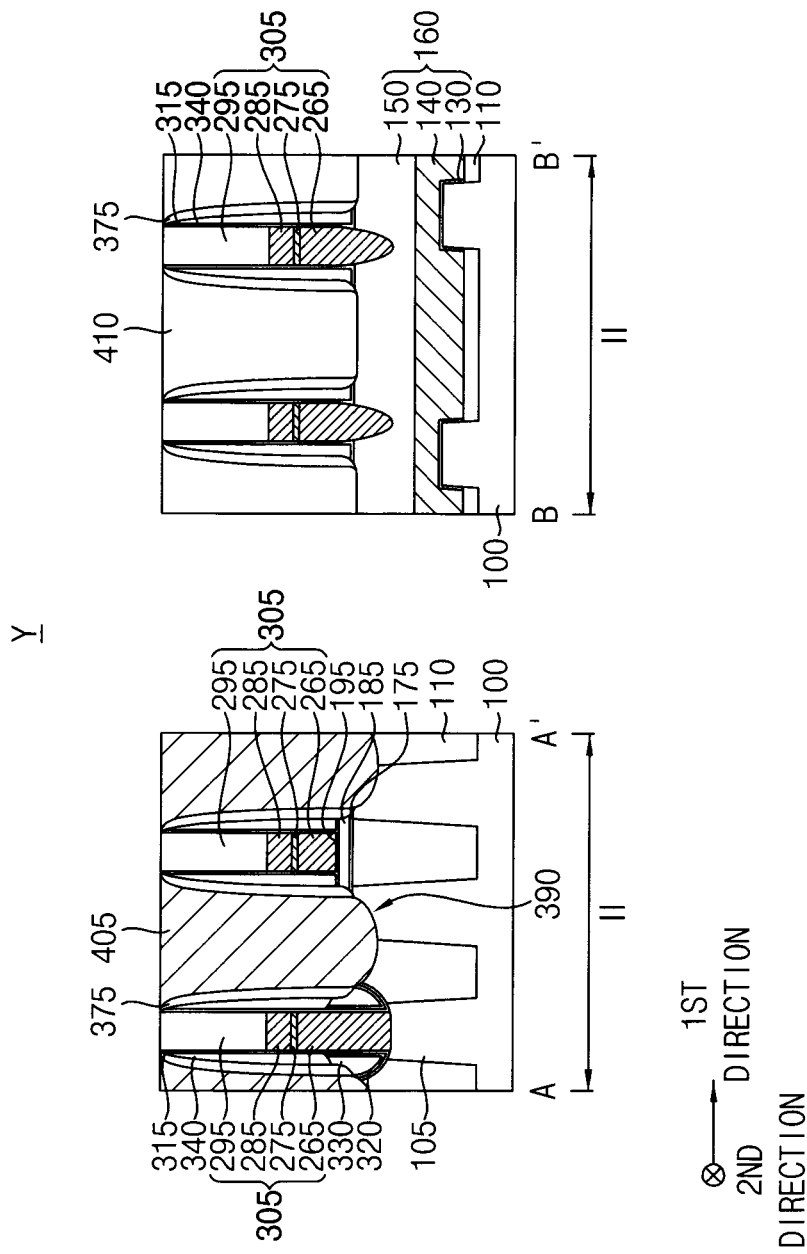

Referring to FIGS. 22 and 23, a third mask (not shown) including fourth openings, each of which may extend in the first direction, spaced apart from each other in the second direction may be formed on the first to third capping patterns 295, 298 and 299, the preliminary lower contact plug 405P and the filling pattern 409, and a portion of the preliminary lower contact plug 405P may be etched to form a lower contact plug 405 using the third mask as an etching mask.

In example embodiments, each of the fourth openings may overlap the portion of the preliminary lower contact plug 405P on the first gate structure 160 in a vertical direction substantially perpendicular to the upper surface of the substrate 100 on the second region II of the substrate 100. By the etching process, the portion of the preliminary lower contact plug 405P may be removed to expose the upper surface of the first gate mask 150 of the first gate structure 160 between the bit line structures 305 on the second region II of the substrate 100.

After removing the third mask, a fourth capping pattern 410 may be formed on the exposed first gate mask 150 on the second region II of the substrate 100 to fill a space between the two neighboring bit line structures 305. The fourth capping pattern 410 may include nitride, e.g., silicon nitride. In example embodiments, the fourth capping pattern 410 may extend in the first direction between the bit line structures 305, and a plurality of fourth capping patterns 410 may be formed in the second direction.

Thus, the lower contact plug 405 extending in the second direction between the bit line structures 305 may be divided into a plurality of pieces spaced apart from each other in the second direction by the fourth capping patterns 410 on the second region II of the substrate 100. For example, the lower contact plug 405 and the fourth capping pattern 410 may be arranged alternately in the second direction.

Figure 24:
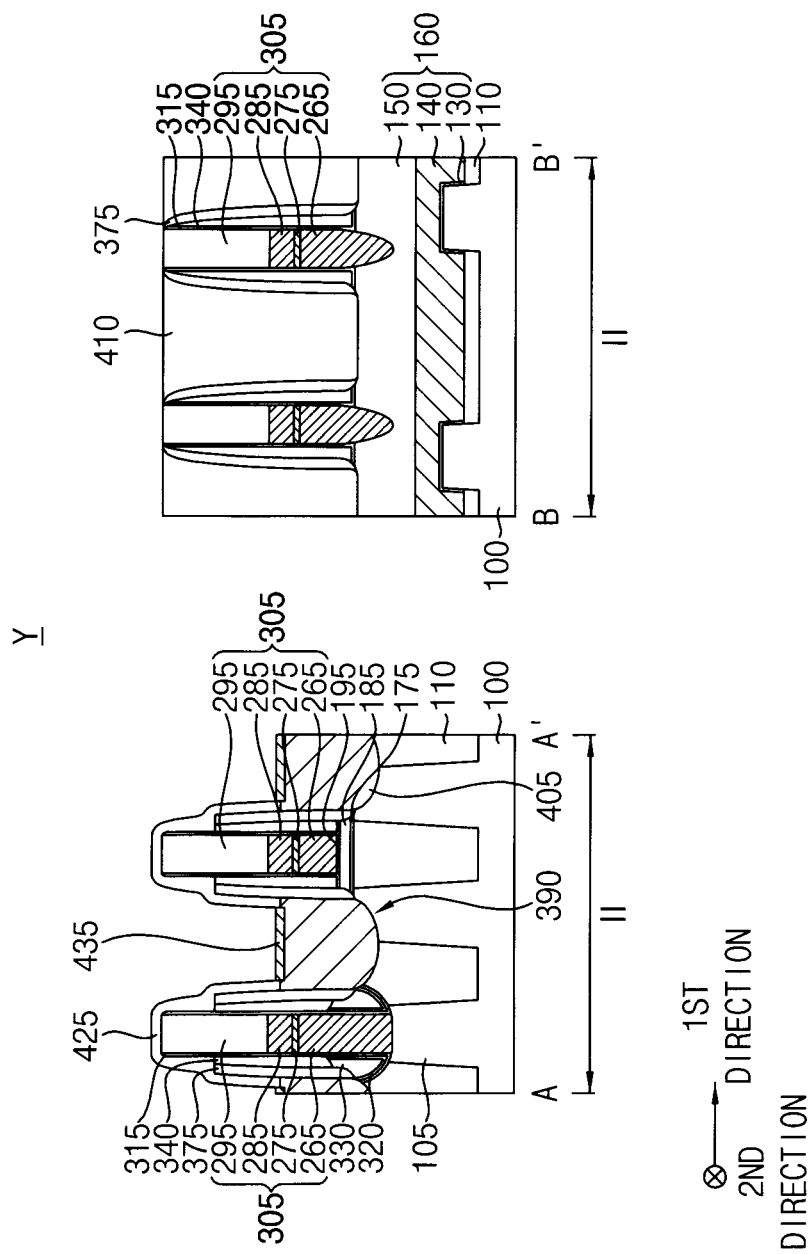
Figure 25:
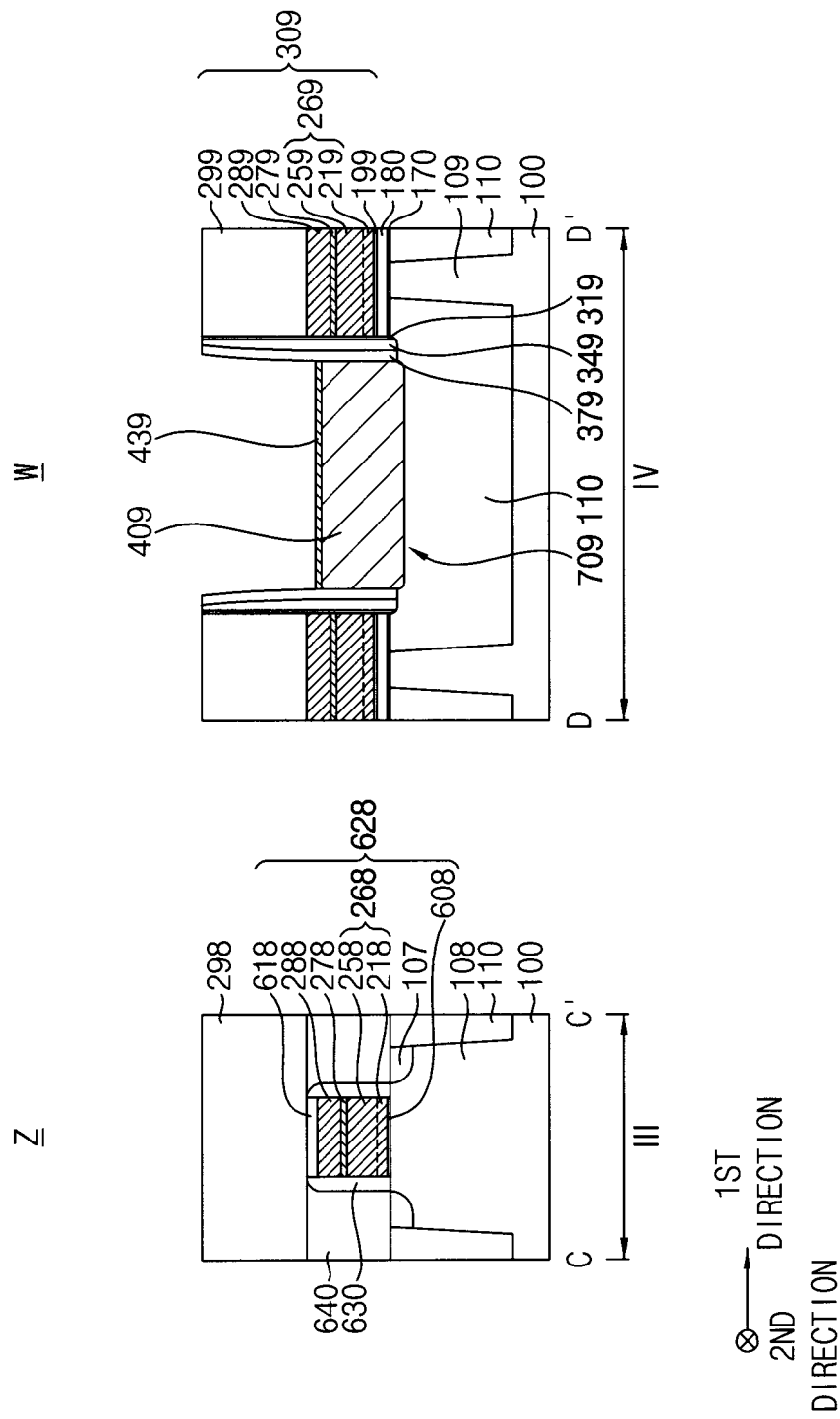

Referring to FIGS. 24 and 25, upper portions of the lower contact plug 405 and the filling pattern 409 may be removed.

In example embodiments, the upper portions of the lower contact plug 405 and the filling pattern 409 may be removed by an etch back process. As illustrated above, the upper surfaces of the lower contact plug 405 and the filling pattern 409 may have the same height. After the etch back process is completed, each of the lower contact plug 405 and the filling pattern 409 may have a predetermined thickness.

As the upper portion of the lower contact plug 405 is removed, an upper portion of the first preliminary spacer structure on the sidewall of the bit line structure 305 may be exposed, and upper portions of the third and fifth spacers 340 and 375 of the exposed first preliminary spacer structure may be removed.

An etch back process may be further performed to remove upper portions of the lower contact plug 405 and the filling pattern 409. Thus, the upper surface of the lower contact plug 405 may be lower than uppermost surfaces of the third and fifth spacers 340 and 375.

By the etch back process, the upper portions of the lower contact plug 405 and the filling pattern 409 may be removed and lower portions thereof may remain, and the upper surfaces of the remaining portions of the lower contact plug 405 and the filling pattern 409 may be flat. However, due to the width difference between the lower contact plug 405 and the filling pattern 409, the upper surfaces of the lower contact plug 405 and the filling pattern 409 may not be coplanar with each other. For example, by the etch back process, the filling pattern 409 having a relatively large width when compared to the lower contact plug 405 having a relatively small width may be less etched, and thus the upper surface of the filling pattern 409 may be higher than the upper surface of the lower contact plug 405 after the etch back process.

A fourth spacer layer may be formed on the bit line structure 305, the first preliminary spacer structure, the second to fourth capping patterns 298, 299 and 410, the lower contact plug 405 and the filling pattern 409, and may be anisotropically etched so that a seventh spacer 425 may be formed to cover the first, third and fifth spacers 315, 340 and 375 on each of opposite sidewalls of the bit line structure 305 in the first direction and an upper surface of the lower contact plug 405 may be exposed without being covered by the seventh spacer 425.

First and second metal silicide patterns 435 and 439 may be formed on the exposed upper surfaces of the lower contact plug 405 and the filling pattern 409. In example embodiments, the first and second metal silicide patterns 435 and 439 may be formed by forming a second metal layer on the first to fourth capping patterns 295, 298, 299 and 410, the seventh spacer 425, the lower contact plug 405 and the filling pattern 409, thermally treating the second metal layer, and removing unreacted portion of the second metal layer. The first and second metal silicide patterns 435 and 439 may include, e.g., cobalt silicide, nickel silicide, titanium silicide, etc.

Figure 26:
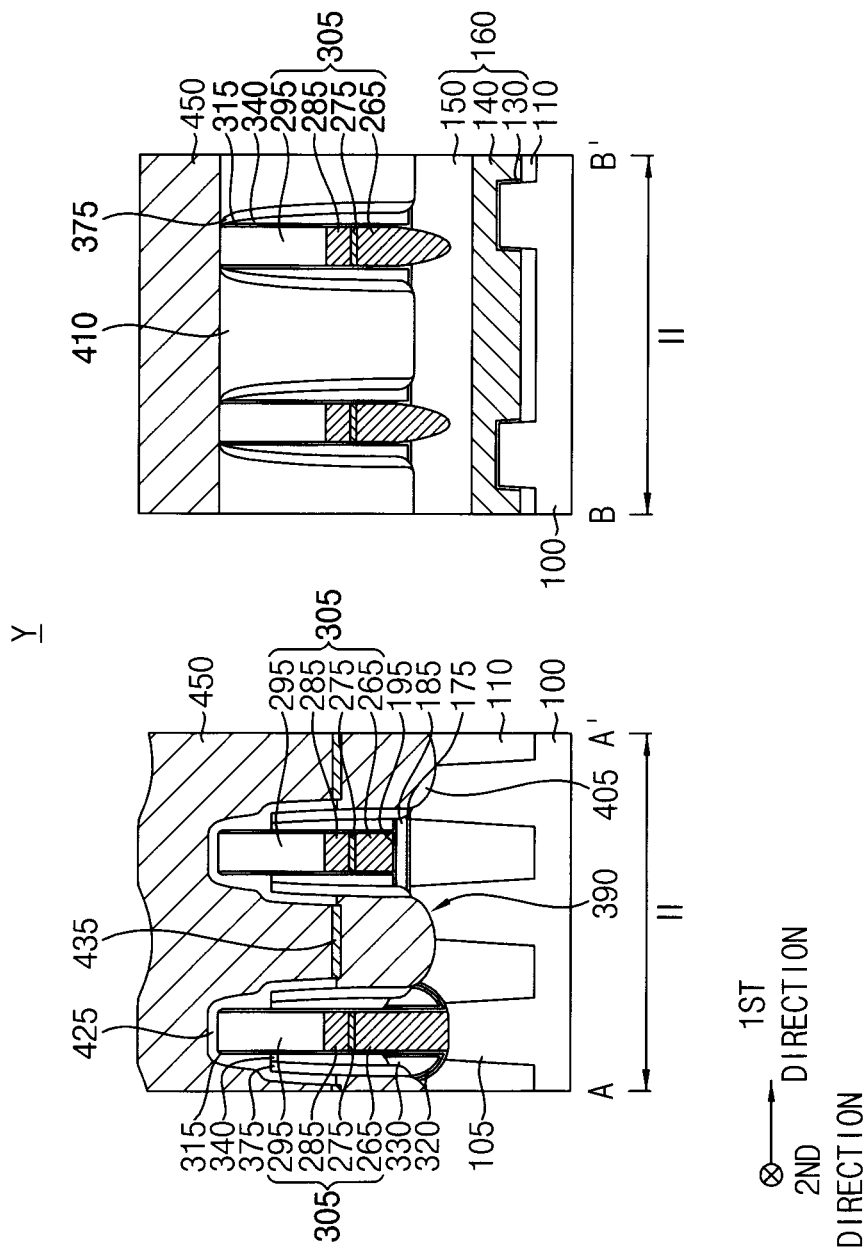
Figure 27:
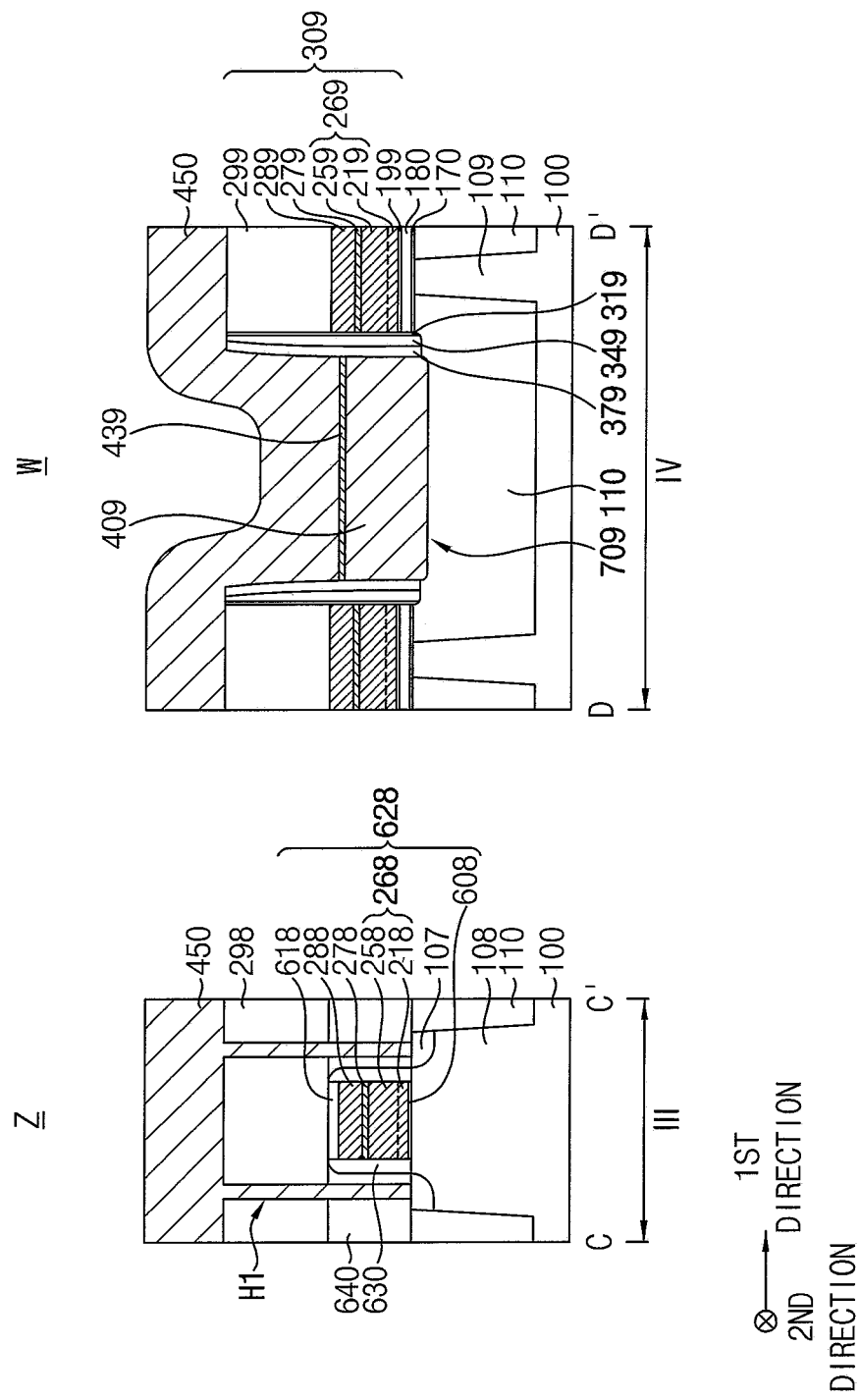

Referring to FIGS. 26 and 27, a first sacrificial layer may be formed on the first to fourth capping patterns 295, 298, 299 and 410, the seventh spacer 425, and the first and second metal silicide patterns 435 and 439, the first sacrificial layer may be planarized until the upper surfaces of the first to fourth capping patterns 295, 298, 299 and 410 may be exposed, and a first hole H1 may be formed on the third region III of the substrate 100.

The first sacrificial layer may include, e.g., silicon-on-hardmask (SOH), amorphous carbon layer (ACL), etc.

The first hole H1 may extend through the second capping pattern 298 and the first insulating interlayer pattern 640 to expose an upper surface of the source/drain layer 107 on the third region III of the substrate 100.

After removing the first sacrificial layer, an upper contact plug layer 450 may be formed on the first to fourth capping patterns 295, 298, 299 and 410, the first, third, fifth and seventh spacers 315, 340, 375 and 425, the first and second metal silicide patterns 435 and 439, the lower contact plug 405, the filling pattern 409 and the source/drain layer 107.

The bit line structures 305 having the first, third, fifth and seventh spacers 315, 340, 375 and 425 on sidewalls thereof may be spaced apart from each other in the first direction on the second region II of the substrate 100, and may have an upper surface higher than that of the first metal silicide pattern 435. The key structures 309 may be formed on the fourth region IV of the substrate 100 and may have an upper surface higher than that of the second metal silicide pattern 439. Thus, an upper surface of the upper contact plug layer 450 may have an uneven upper surface.

In example embodiments, the upper contact plug layer 450 may be conformally formed on the key structures 309 and the second metal silicide pattern 439 on the fourth region IV of the substrate 100. Thus, an upper surface of a portion of the upper contact plug layer 450 on the second metal silicide pattern 439 may be lower than an upper surface of a portion of the upper contact plug layer 450 on the key structure 309.

In example embodiments, the upper contact plug layer 450 may include metal, e.g., tungsten.

Figure 28:
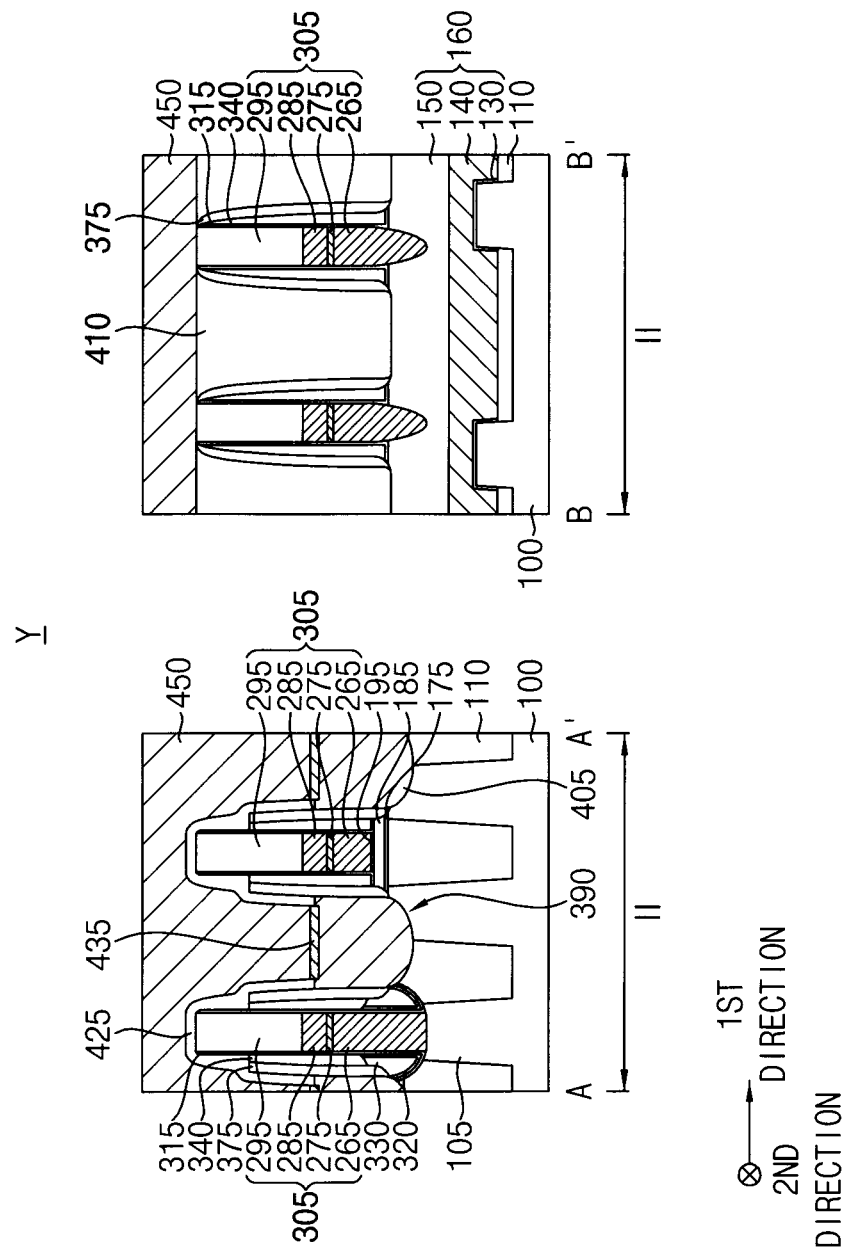
Figure 29:
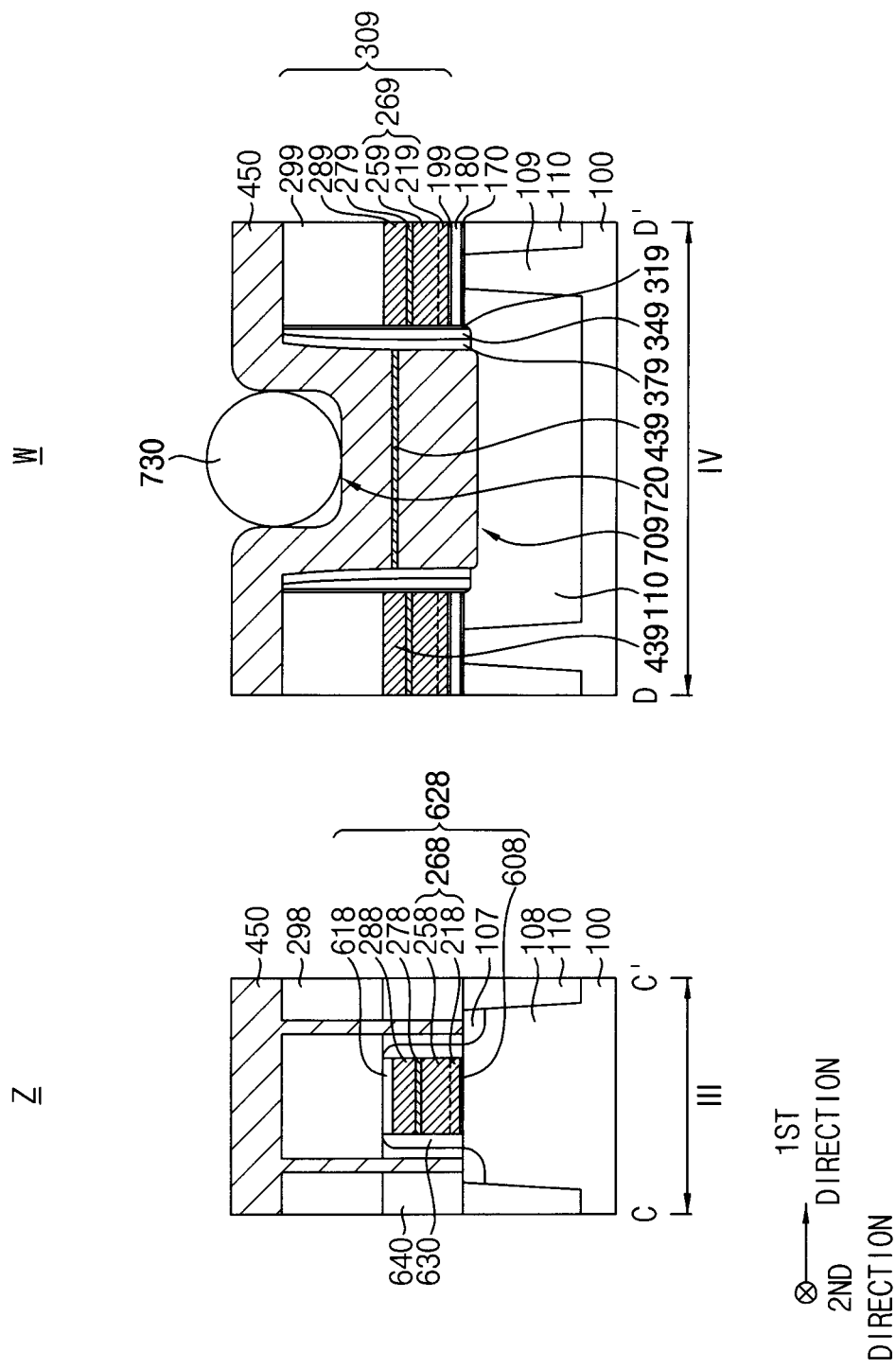

Referring to FIGS. 28 and 29, an upper portion of the upper contact plug layer 450 may be planarized by a CMP process.

The CMP process may be performed such that an upper surface of the upper contact plug layer 450 may be higher than those of the bit line structures 305 and the key structures 309. For example, no polishing stop layer may be used, and thus it may be difficult to control time for the CMP process. However, there is a height difference between upper surfaces of portions of the upper contact plug layer 450 on the second metal silicide pattern 439 and the key structure 309, and thus the time for the CMP may be controlled by using the height difference.

By the CMP process, a portion of the upper contact plug layer 450 on the second and third regions II and III of the substrate 100 may have a flat upper surface, and a portion of the upper contact plug layer 450 on the fourth region IV of the substrate 100 may have a constant thickness on upper surfaces of the key structures 309 and the second metal silicide pattern 439. A third trench 720 may be defined by the upper contact plug 450 on the fourth region IV of the substrate 100. For example, the third trench 720 may be defined by an uneven upper surface of the upper contact plug 450. The upper contact plug 450 may be disposed on an upper sidewall and an upper surface of the key structure 309 and an upper surface of the second metal silicide pattern 439. The third trench 720 may have a flat bottom and a sidewall that may be close to a right angle, for example, an angle equal to or more than 75 degrees with respect to the upper surface of the substrate 100. For example, a sidewall of a portion of the upper contact plug layer 450 on the upper sidewall of the key structure 309 may be almost vertical.

A slurry particle 730 used in the CMP process may not be entirely removed but partially remain, and for example, may remain in the third trench 720 having a concave shape. The slurry particle 730 may include, e.g., silicon oxide.

Figure 30:
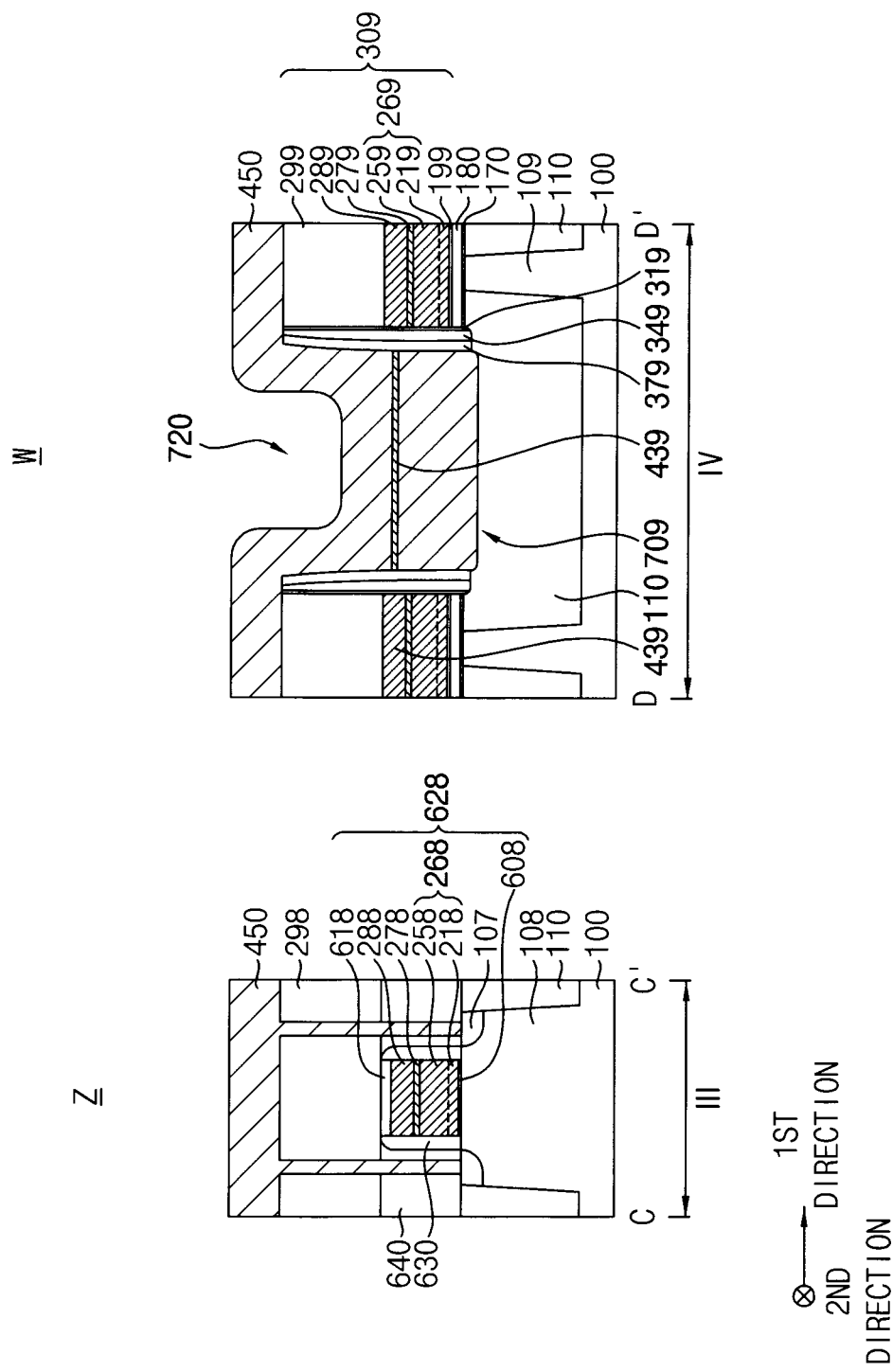

Referring to FIG. 30, a cleansing process may be performed to remove impurities generated in the CMP process.

By the cleansing process, the slurry particle 730 remaining in the third trench 720 may be removed. In an exemplary embodiment, the third trench 720 may have a depth smaller than that of the second trench 709 (refer to FIG. 13) by the filling pattern 409 and the second metal silicide pattern 439, and thus an upper portion of the slurry particle 730 may be exposed above the third trench 720, so as to be easily removed by the cleansing process. In an example embodiment, the depth of the third trench 720 may be smaller than a diameter of a slurry particle for the CMP process.

Figure 31:
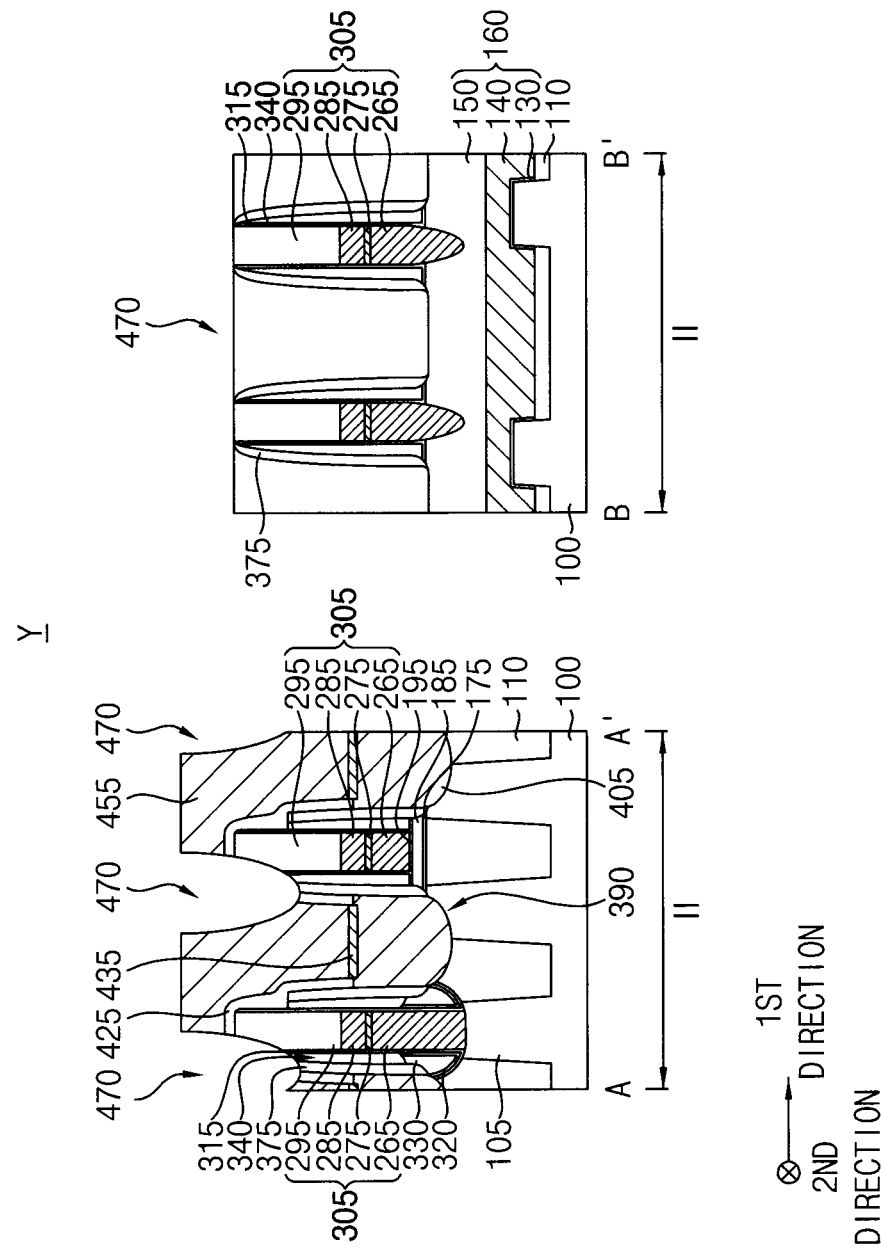
Figure 32:
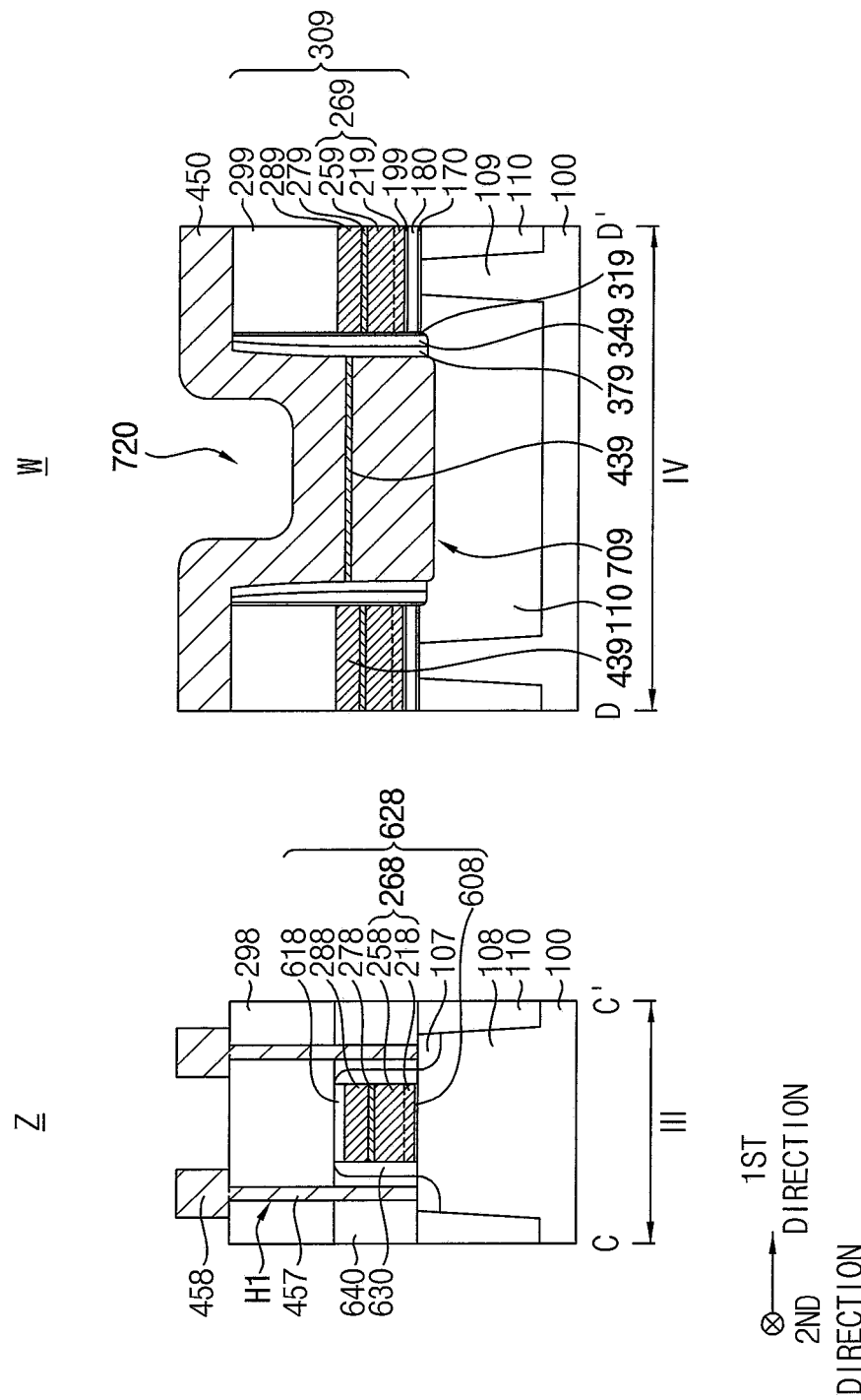

Referring to FIGS. 31 and 32, a portion of the upper contact plug layer 450 on the second region II of the substrate 100 may be etched to form a second hole 470, and a portion of the upper contact plug layer 450 on the third region III of the substrate 100 may be patterned.

The second hole 470 may be formed by removing an upper portion of the upper contact plug layer 450, an upper portion of the first capping pattern 295, and upper portions of the first, fifth and seventh spacers 315, 375 and 425 on the second region II of the substrate 100, and may expose an upper surface of the third spacer 340.

The second hole 470 may divide the upper contact plug layer 450 into a plurality of upper contact plugs 455 on the second region II of the substrate 100. In example embodiments, the plurality of upper contact plugs 455 may be formed in the first and second directions and may be arranged in a honeycomb pattern in a plan view. Each of the upper contact plugs 455 may have a shape of a circle, an ellipse, or a polygon.

The lower contact plug 405, the first metal silicide pattern 435 and the upper contact plug 455 sequentially stacked on the second region II of the substrate 100 may form a first contact plug structure.

As the upper contact plug layer 450 is patterned on the third region III of the substrate 100, a second contact plug 457 filling the first hole H1 and a wiring 458 contacting an upper surface of the second contact plug 457 may be formed. The second contact plug 457 and the wiring 458 may be electrically connected to the source/drain layer 107. In an example embodiment, the wiring 458 may be electrically connected to the bit line structure 305 on the second region II of the substrate 100, and may apply electrical signals to the bit line structure 305. The term "contact," as used herein, refers to a direct connection (i.e., touching) unless the context indicates otherwise.

In example embodiments, during the formation of the wiring 458, the third trench 720 may serve as an overlay key in a photolithography process for patterning the upper contact plug layer 450. For example, a mask for the photolithography process may be aligned to a semiconductor wafer using the third trench 720 as the overlay key. As illustrated above, the third trench 720 with an almost vertical sidewall may serve as the overlay key.

A portion of the upper contact plug layer 450 remaining on the fourth region IV of the substrate 100 may be referred to as a third conductive structure 459.

Figure 33:
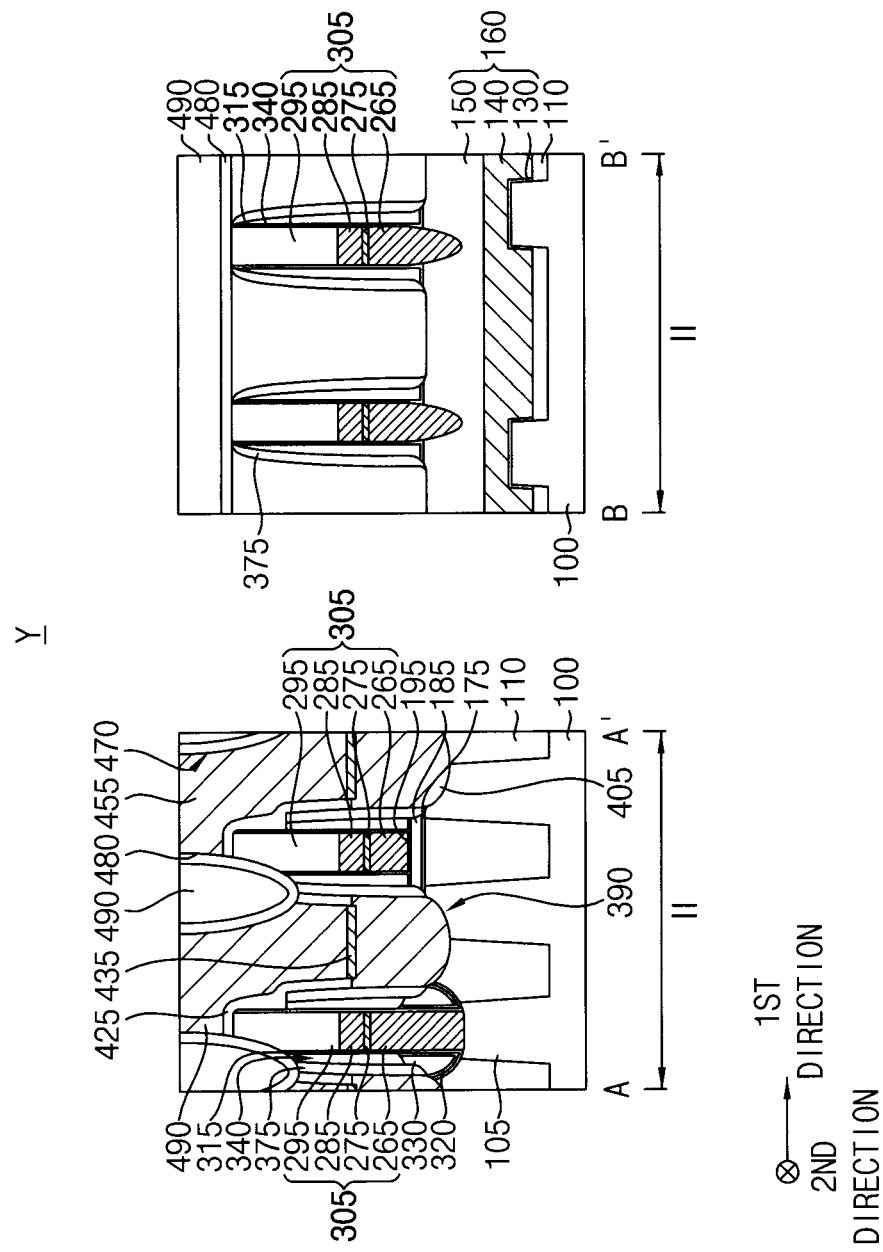
Figure 34:
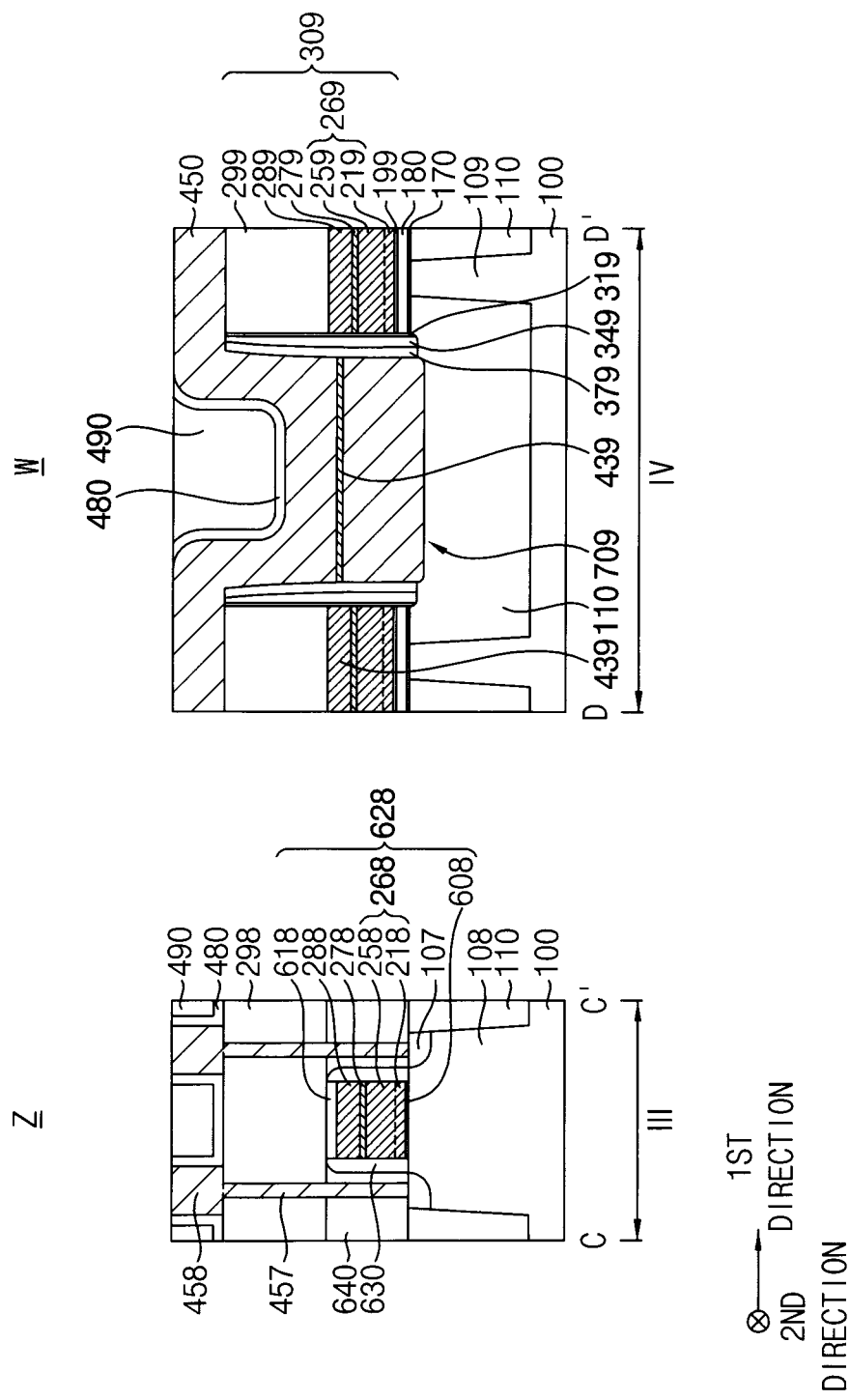

Referring to FIGS. 33 and 34, the third spacer 340 exposed by the second hole 470 may be removed to form a second air gap 345 connected to the second hole 470. The third spacer 340 may be removed by, e.g., a wet etching process. The term "air" as discussed herein, may refer to atmospheric air, or other gases that may be present during the manufacturing process.

In example embodiments, not only a portion of the third spacer 340 on the sidewall of the bit line structure 305 extending in the second direction directly exposed by the second hole 470 but also other portions of the third spacer 340 parallel to the directly exposed portion thereof in the horizontal direction may be removed. For example, not only the portion of the third spacer 340 exposed by the second hole 470 not to be covered by the upper contact plug 455 but also a portion of the third spacer 340 adjacent to the exposed portion in the second direction to be covered by the fourth capping pattern 410 and a portion of the third spacer 340 adjacent to the exposed portion in the second direction to be covered by the upper contact plug 455 may be all removed to form the second air gap 345.

Third and fourth insulating interlayers 480 and 490 may be sequentially stacked to fill the second hole 470 on the second region II of the substrate 100, a space between the wirings 458 on the third region III of the substrate 100, and the third trench 720 on the fourth region IV of the substrate 100. The third and fourth insulating interlayers 480 and 490 may also be sequentially stacked on the fourth capping pattern 410.

The third insulating interlayer 480 may include a material having a low gap filling characteristic, and thus the second air gap 345 under the second hole 470 may not be filled. The second air gap 345 may also be referred to as an air spacer 345 and may form a first spacer structure together with the first, fifth and seventh spacers 315, 375 and 425. For example, the second air gap 345 may be a spacer including an air. The fourth insulating interlayer 490 may include nitride, e.g., silicon nitride.

Figure 35:
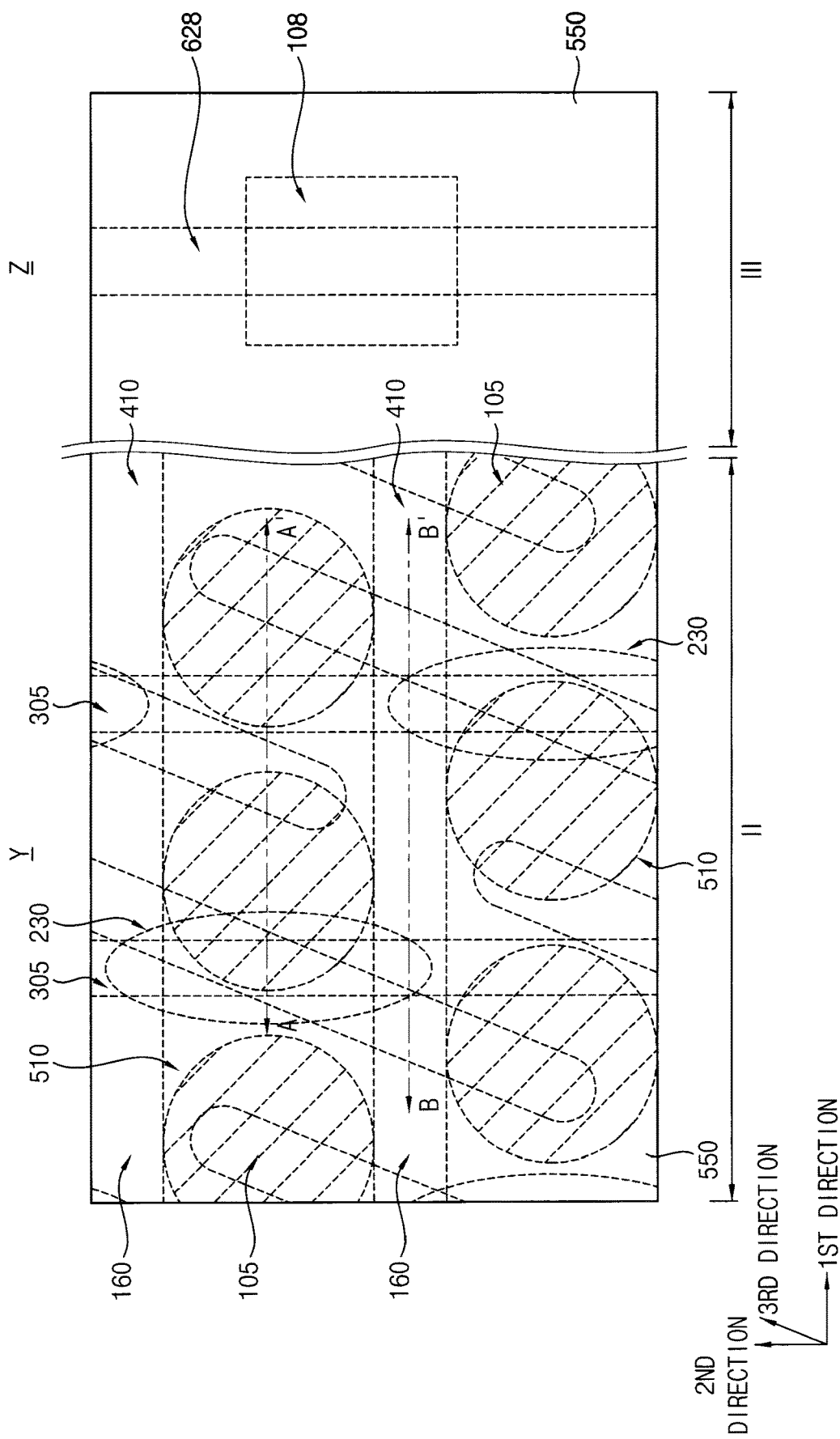
Figure 36:
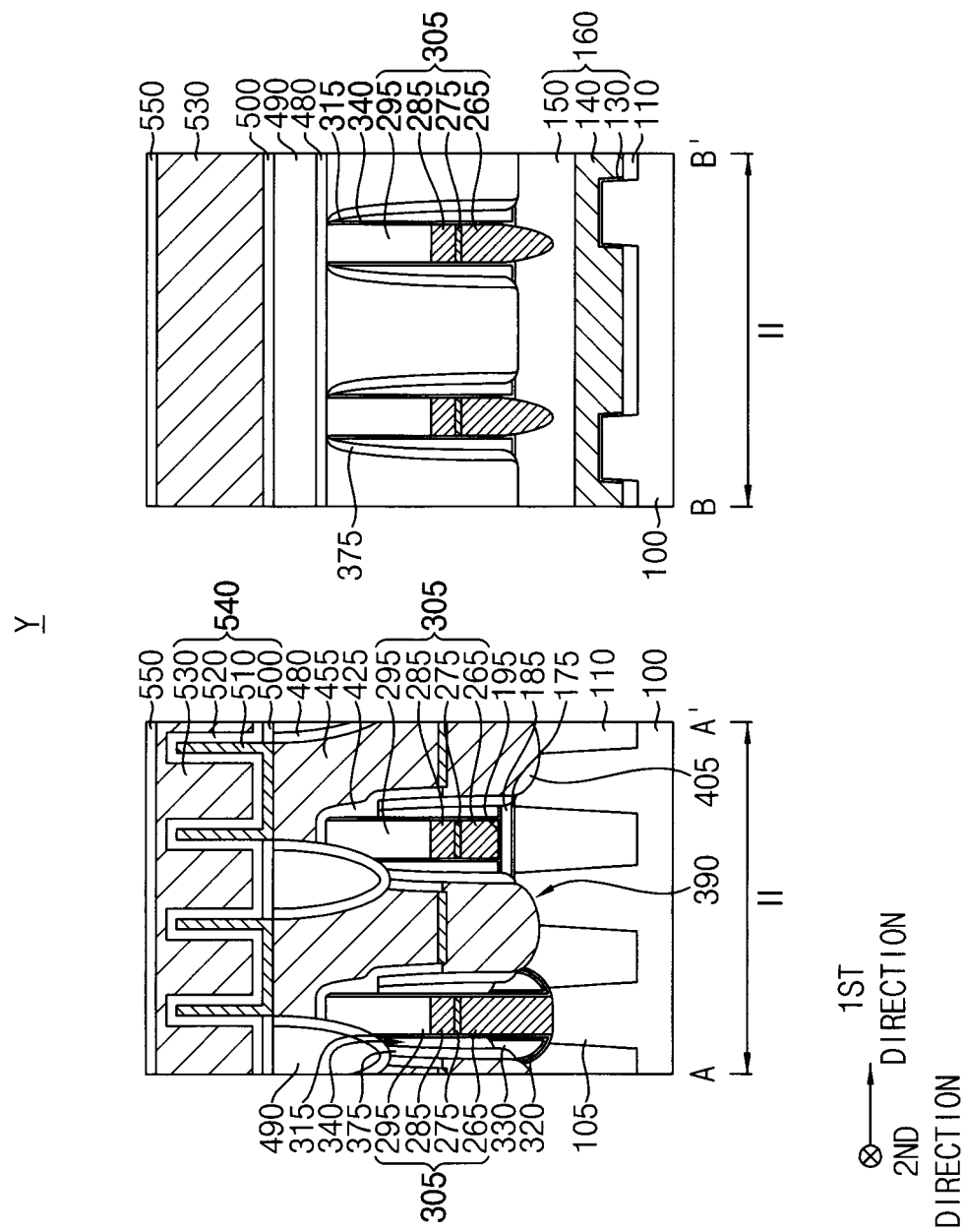
Figure 37:
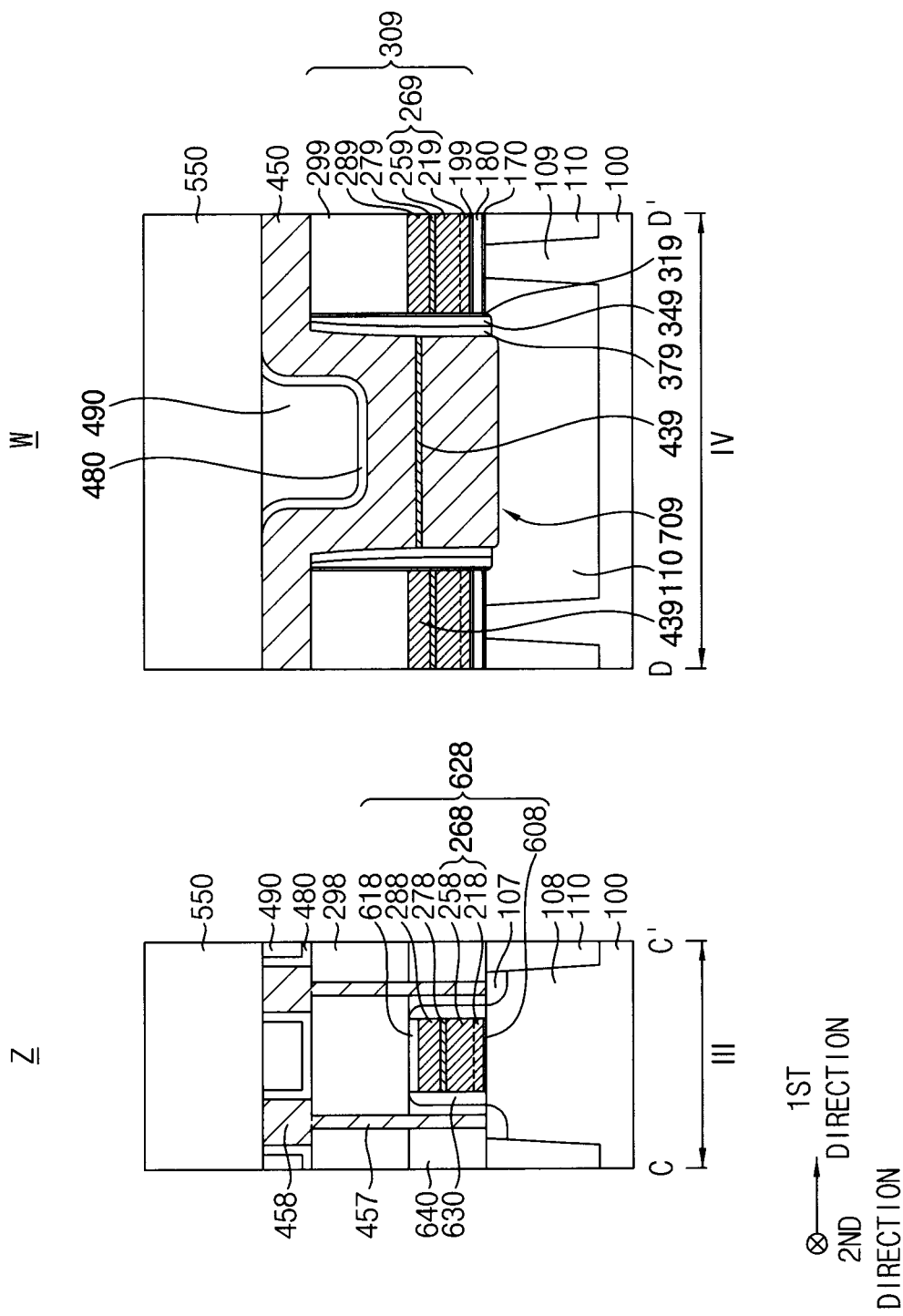

Referring to FIGS. 35 to 37, a capacitor 540 may be formed to contact the upper surface of the upper contact plug 455.

In an example embodiment, an etch stop layer 500 and a mold layer (not shown) may be sequentially formed on the upper contact plug 455, the third and fourth insulating interlayers 480 and 490, the wiring 458 and the third conductive structure 459, and partially etched to form a sixth opening partially exposing the upper surface of the upper contact plug 455.

A lower electrode layer (not shown) may be formed on a sidewall of the sixth opening, the exposed upper surface of the upper contact plug 455 and the mold layer, a second sacrificial layer (not shown) may be formed on the lower electrode layer to fill the sixth opening, and the lower electrode layer and the second sacrificial layer may be planarized until an upper surface of the mold layer may be exposed to divide the lower electrode layer. The second sacrificial layer and the mold layer may be removed by, e.g., a wet etching process, and thus a lower electrode 510 having a cylindrical shape may be formed on the exposed upper surface of the upper contact plug 455. Alternatively, the lower electrode 510 may have a pillar shape filling the sixth opening.

A dielectric layer 520 may be formed on a surface of the lower electrode 510 and the etch stop layer 500, and an upper electrode 530 may be formed on the dielectric layer 520 so that the capacitor 540 including the lower electrode 510, the dielectric layer 520 and the upper electrode 530 may be formed.

A fifth insulating interlayer 550 may be formed to cover the capacitor 540 on the second to fourth regions II, III and IV of the substrate 100. The fifth insulating interlayer 550 may include oxide, e.g., silicon oxide. Upper wirings (not shown) may be further formed to form semiconductor chips on the respective first regions I of the substrate 100.

A dicing process or a sawing process may be performed so that the semiconductor chips on the respective first regions I of the substrate 100 may be divided, and thus the fabrication of the semiconductor device may be completed.

Figure 38:
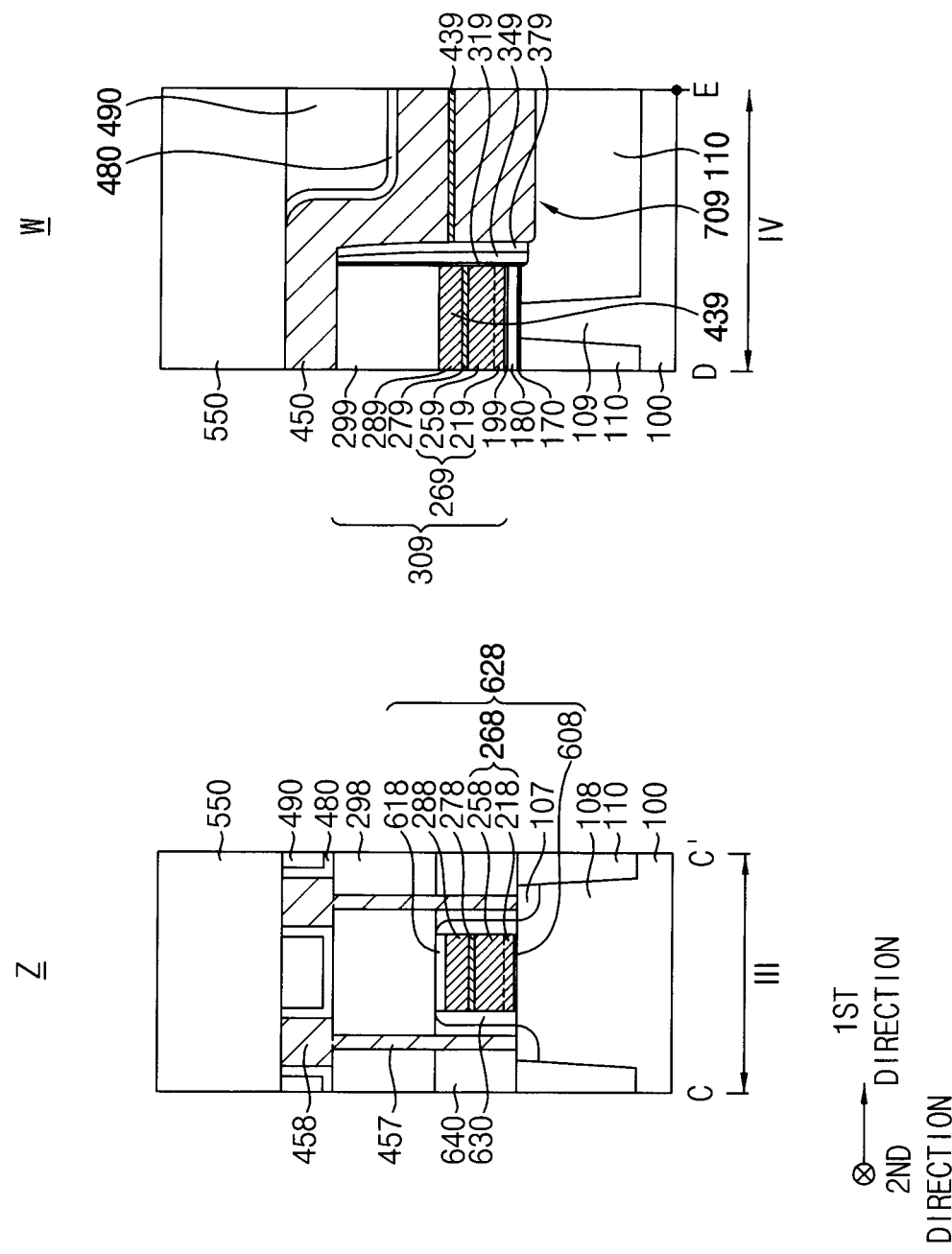

FIG. 38 shows only a portion of the semiconductor device taken along a line D-E of FIG. 2 remains according to the partial removal of the semiconductor device on the region W in the fourth region IV of the substrate 100 by the dicing process.

As illustrated above, the lower contact plug layer 400 filling the first trench 705 between the bit line structures 305 may fill the second trench 709 between the key structures 309 on the fourth region IV of the substrate 100, and the upper surface of the portion of the lower contact plug layer 400 on the second trench 709 may be lower than the upper surface of the portion of the lower contact plug layer 400 on the key structures 309. However, before the CMP process is performed on the lower contact plug layer 400, a melting process, e.g., a laser annealing process, may be performed so that the height difference between portions of the lower contact plug layer 400 on the fourth region IV of the substrate 100 may decrease. Thus, the CMP process may be performed until the upper surfaces of the bit line structures 305 and the key structures 309 may be exposed, so that the upper surface of the filling pattern 409 in the second trench 709 may be substantially flat and substantially coplanar with the upper surfaces of the key structures 309.

Even though an etch back process is performed on the filling pattern 409, the filling pattern 409 may not be entirely removed, and at least a lower portion thereof may remain in the second trench 709 so that a depth of the second trench 709 may decrease and that the flatness of the upper surface of the filling pattern 409 may be kept. Thus, the upper contact plug layer 450 may be formed on the lower contact plug 405 and the filling pattern 409, and a CMP process may be performed on the upper contact plug layer 450, so that the third trench 720 on a portion of the upper contact plug layer 450 on the second trench 709 may have a depth smaller than that of the second trench 709. Accordingly, the slurry particle 730 remaining in the third trench 720 after the CMP process may be easily removed by the cleansing process, and thus may not damage other structures in subsequent processes.

Additionally, the third trench 720 on the upper contact plug layer 450, which may be conformally formed on the filling pattern 409 filling a lower portion of the second trench 709 having a vertical sidewall and having a flat upper surface and the second metal silicide pattern 439 thereon, may have an almost vertical sidewall, and when the wiring 458 is formed by patterning the upper contact plug layer 450, the third trench 720 may serve as an overlay key.

Up to this point, the lower contact plug layer 400 including a conductive material, e.g., doped polysilicon, fills the first trench 705 between the bit line structures and the second trench 709 between the key structures 309, however, the inventive concept may not be limited thereto.

For example, if first structures (e.g., bit line structures 305) and second structures (e.g., key structures 309) are formed on the second and fourth regions II and IV, respectively, of the substrate 100, and the second with W2 of the second trench 709 between the second structures is greater than the first width W1 of the first trench 705 between the first structures, a filling layer may be formed to fill the first trench 705 and the second trench 709, a melting process, e.g., a laser annealing process, may be performed on the filling layer to decrease the height difference of portions of the filling layer, and the filling layer may be planarized by a CMP process, such that first and second filling patterns may be formed in the first trench 705 and the second trench 709, respectively, to have substantially coplanar upper surfaces. The filling layer may include a conductive material. The present invention is not limited thereto. In an example embodiment, the filling layer may include any material that flows in the melting process so that a height difference is relieved. For example, the filling layer may include polysilicon, oxide, nitride, etc.

Upper portions of the first and second filling patterns may be removed, a conductive layer may be conformally formed on the first and second filling patterns, and may be planarized by a CMP process, such that a conductive structure having an almost vertical sidewall and the shallow third trench 720 may be formed on the second filling pattern in the second trench 709. Accordingly, even if the slurry particle 730 used in the CMP process remains in the third trench 720, the slurry particle 730 may be easily removed by a cleansing process, and the conductive structure may also serve as an overlay key.

The semiconductor device manufactured by the above method may have the following structural features.

The semiconductor device may include the chip region I having the cell region II and the peripheral circuit region III at least partially surrounding the cell region II, and the scribe lane region IV surrounding the chip region I. The first to third active patterns 105, 108 and 109, which may be defined by the isolation pattern 110, may be formed on the cell region II, the peripheral circuit region III and the scribe lane region IV, respectively, of the substrate 100.

The semiconductor device may include the first gate structures 160 each of which may be buried in an upper portion of the first active pattern 105, the bit line structures 305 on the cell region II of the substrate 100, the first contact plug structures on the respective first active patterns 105 between the bit line structures 305, and the capacitors 540 on the respective first contact plug structures. Each of the first contact plug structures may include the lower and upper contact plugs 405 and 455 sequentially stacked.

Additionally, the semiconductor device may include the second gate structure 628 on the second active pattern 108 on the peripheral circuit region III of the substrate 100, the second contact plug 457 on the second active pattern 108 adjacent to the second gate structure 628, and the wiring 458 on the second contact plug 457.

Furthermore, the semiconductor device may include the key structures 309 having the same stacked structure as the bit line structures 305 and having the upper surfaces substantially coplanar with the upper surfaces of the bit line structures 305, which may be spaced apart from each other by the second trench 709, on the scribe lane region IV of the substrate 100, the filling pattern 409 having a flat surface and including a conductive material in the lower portion of the second trench 709, and the third conductive structure 459 on the upper sidewall of the second trench 709 and the upper surfaces of the key structures 309.

In example embodiments, the third conductive structure 459 may have a constant thickness, and a sidewall of a portion of the third conductive structure 459 on the upper sidewall of the second trench 709 may have an angle equal to or more than about 75 degrees with respect to the upper surface of the substrate 100.

In example embodiments, a distance between the key structures 309 may be greater than that of the bit line structures 305.

In example embodiments, the lower contact plug 405 may include the same material as the filling pattern 409, and the upper contact plug 455 may include the same material as that of the wiring 458 and the third conductive structure 459. An upper surface of the upper contact plug 455 may be substantially coplanar with those of the wiring 458 and the third conductive structure 459. In an example embodiment, the wiring 458 may be electrically connected to the bit line structure 305 to apply electrical signals thereto.

In example embodiments, the first metal silicide pattern 435 may be formed between the lower and upper contact plugs 405 and 455, and the second metal silicide pattern 439 may be formed between the filling pattern 409 and the third conductive structure 459. The first and second metal silicide patterns 435 and 439 may include the same material.

In example embodiments, the second, fourth and sixth spacers 319, 349 and 379 including nitride, oxide and nitride, respectively, may be sequentially stacked in the horizontal direction on the sidewall of each of the key structures 309.

Each of the key structures 309 may be formed on the third active pattern 109 and the isolation pattern 110, and the filling pattern 409 may be formed on the isolation pattern 110. In example embodiments, a bottom surface of the filling pattern 409 may be lower than those of the key structures 309 and may be lower than an upper surface of the third active pattern 109.

Figure 39:
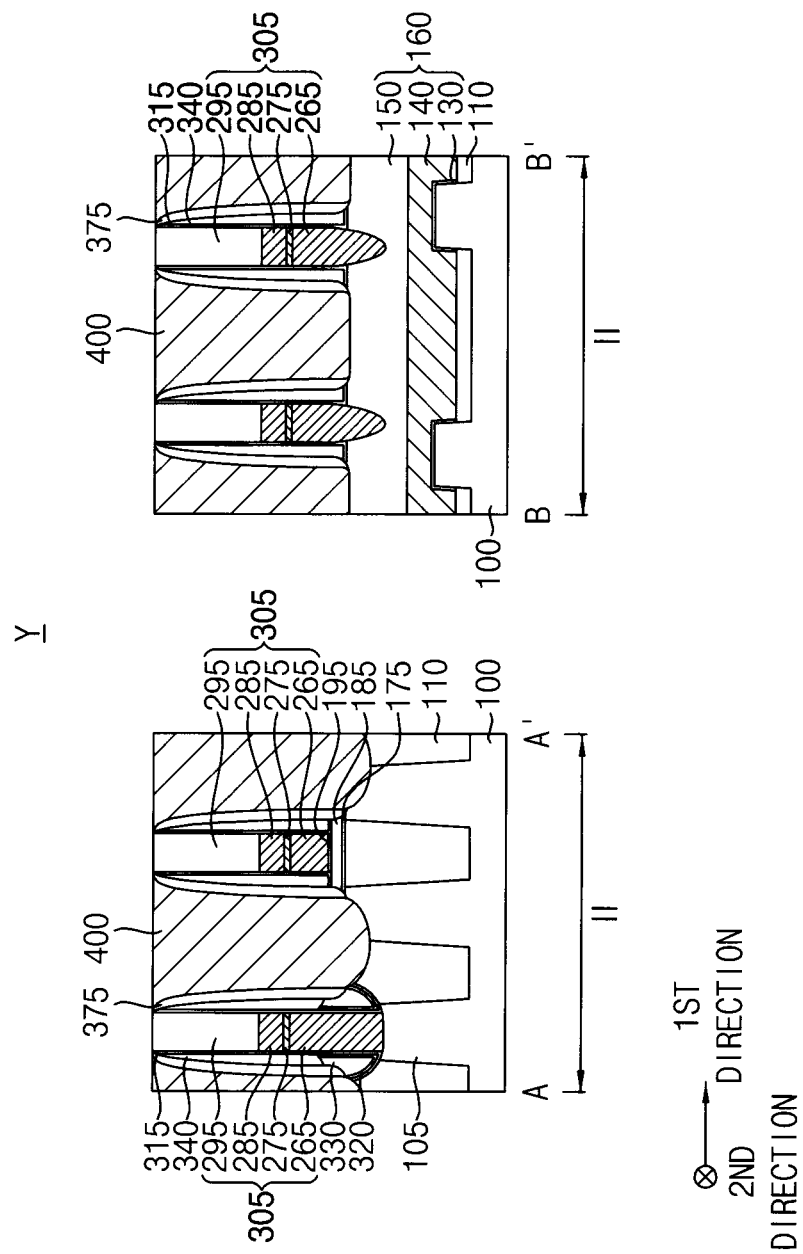
FIGS. 39 to 42 are cross-sectional views illustrating a method of manufacturing a semiconductor device according to a comparative embodiment.

FIGS. 39 to 42 are cross-sectional views illustrating a method of manufacturing a semiconductor device according to a comparative embodiment. FIG. 39 includes cross-sections taken along lines A-A' and B-B' of a region Y of a corresponding plan view, and FIGS. 40 to 42 include cross-sections taken along lines C-C' and D-D' of regions Z and W of corresponding plan views.

This method may include processes substantially the same as or similar to those illustrated with reference to FIGS. 1 to 38, and thus repetitive descriptions thereon are omitted herein.

Figure 40:
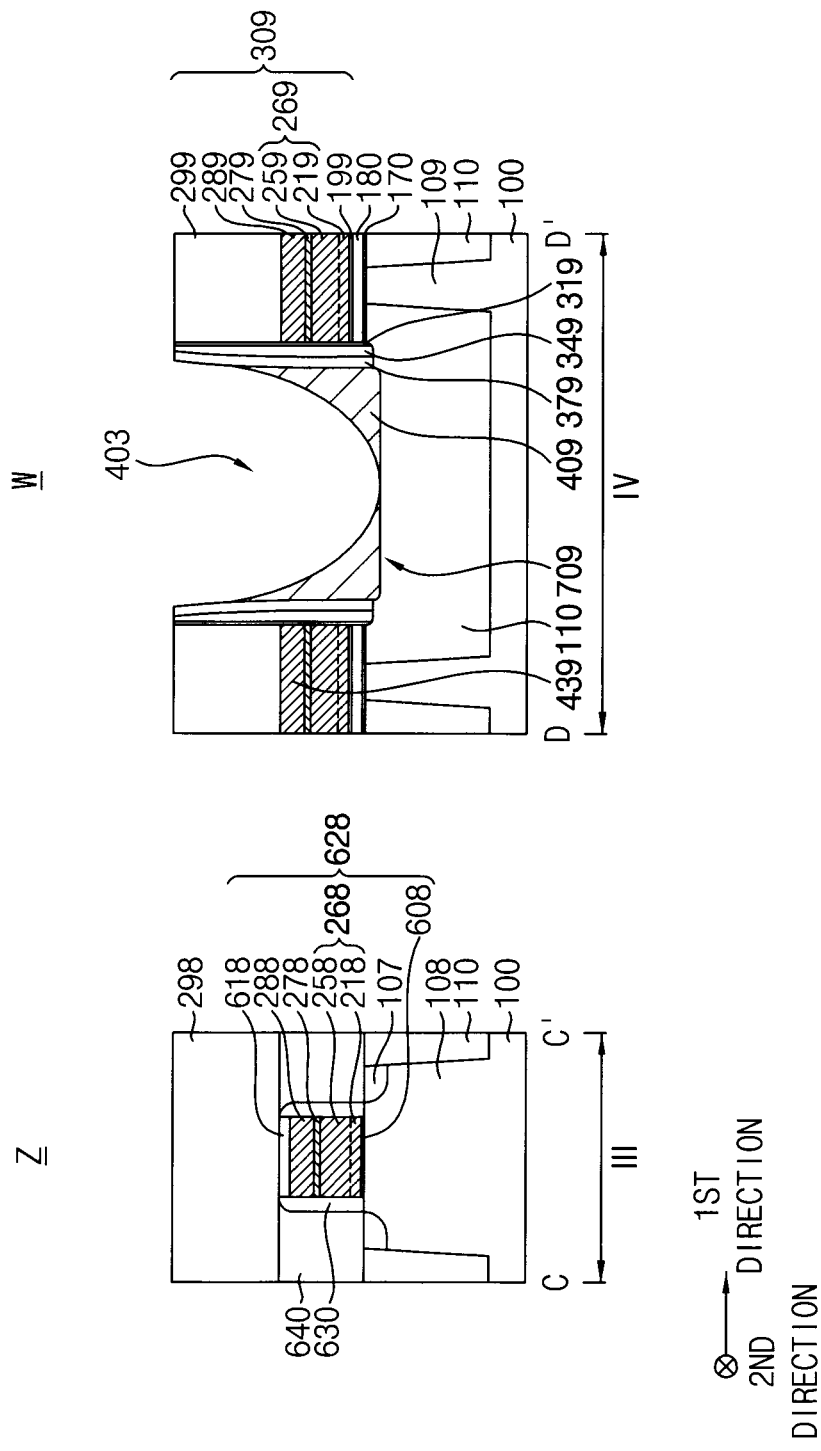

Referring to FIGS. 39 and 40, processes substantially the same as or similar to those illustrated with reference to FIGS. 1 to 17 may be performed, and without performing the melting process illustrated with reference to FIGS. 18 and 19, the CMP process illustrated with reference to FIGS. 20 and 21 may be performed.

On the fourth region IV of the substrate 100, a height of an upper surface of the lower contact plug layer 400 on the second trench 709 may be much less than a height of an upper surface of the lower contact plug layer 400 on the key structure 309, and thus an upper surface of the filling pattern 409 remaining in the second trench 709 may be concave, so that a fifth recess 403 may be formed on the filling pattern 409.

Figure 41:
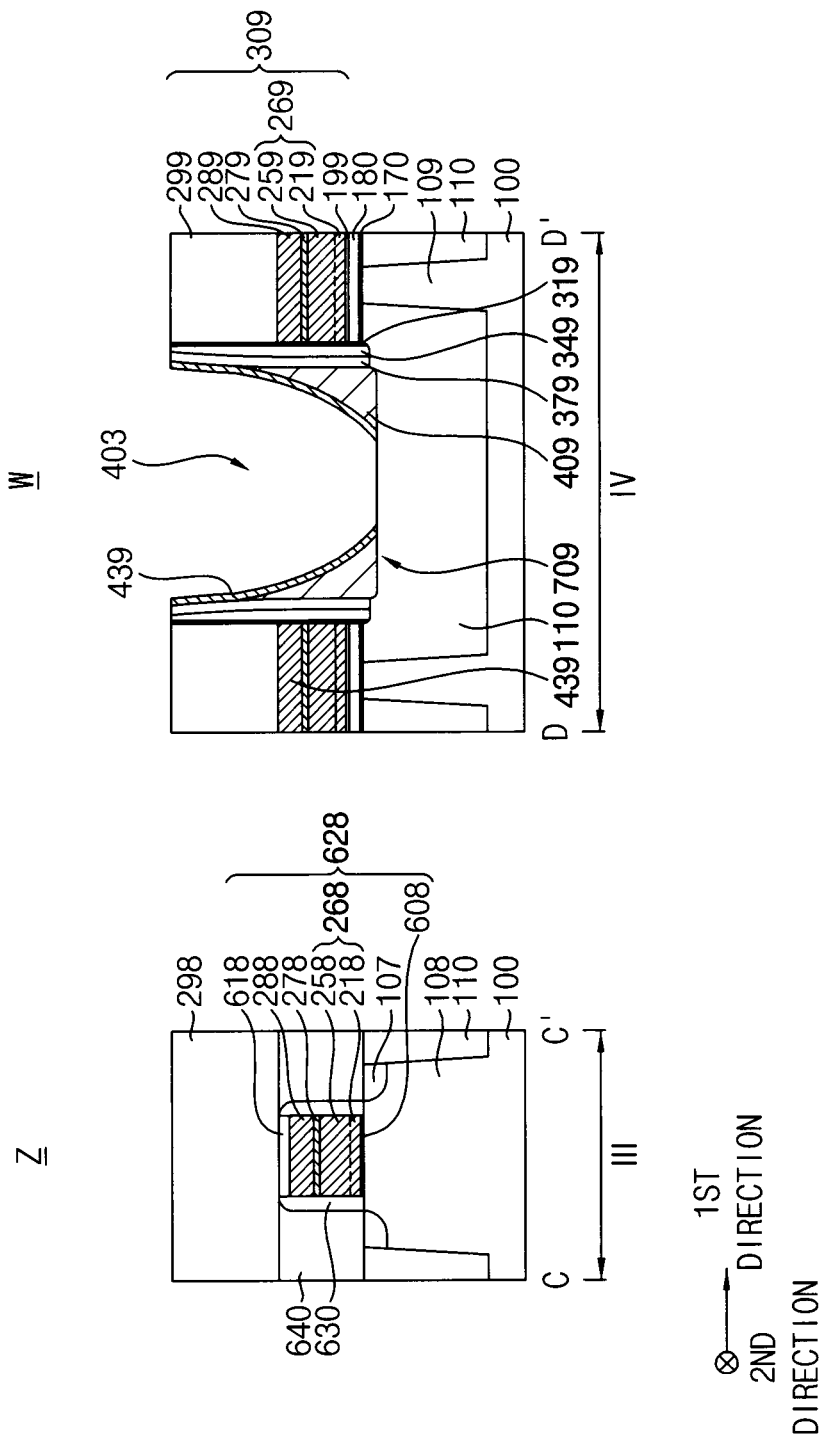

Referring to FIG. 41, processes substantially the same as or similar to FIGS. 22 to 25 may be performed.

When the upper portion of the lower contact plug 405 is removed by the etch back process, the filling pattern 409 remaining in the second trench 709 may be partially removed, and since the concave fifth recess 403 is formed on the filling pattern 409, a central portion of the filling pattern 409 may be entirely removed by the etch back process to form a third trench 404 exposing an upper surface of the second insulation layer 180.

The second metal silicide pattern 439 may be further formed on the upper surface of the remaining filling pattern 409.

Figure 42:
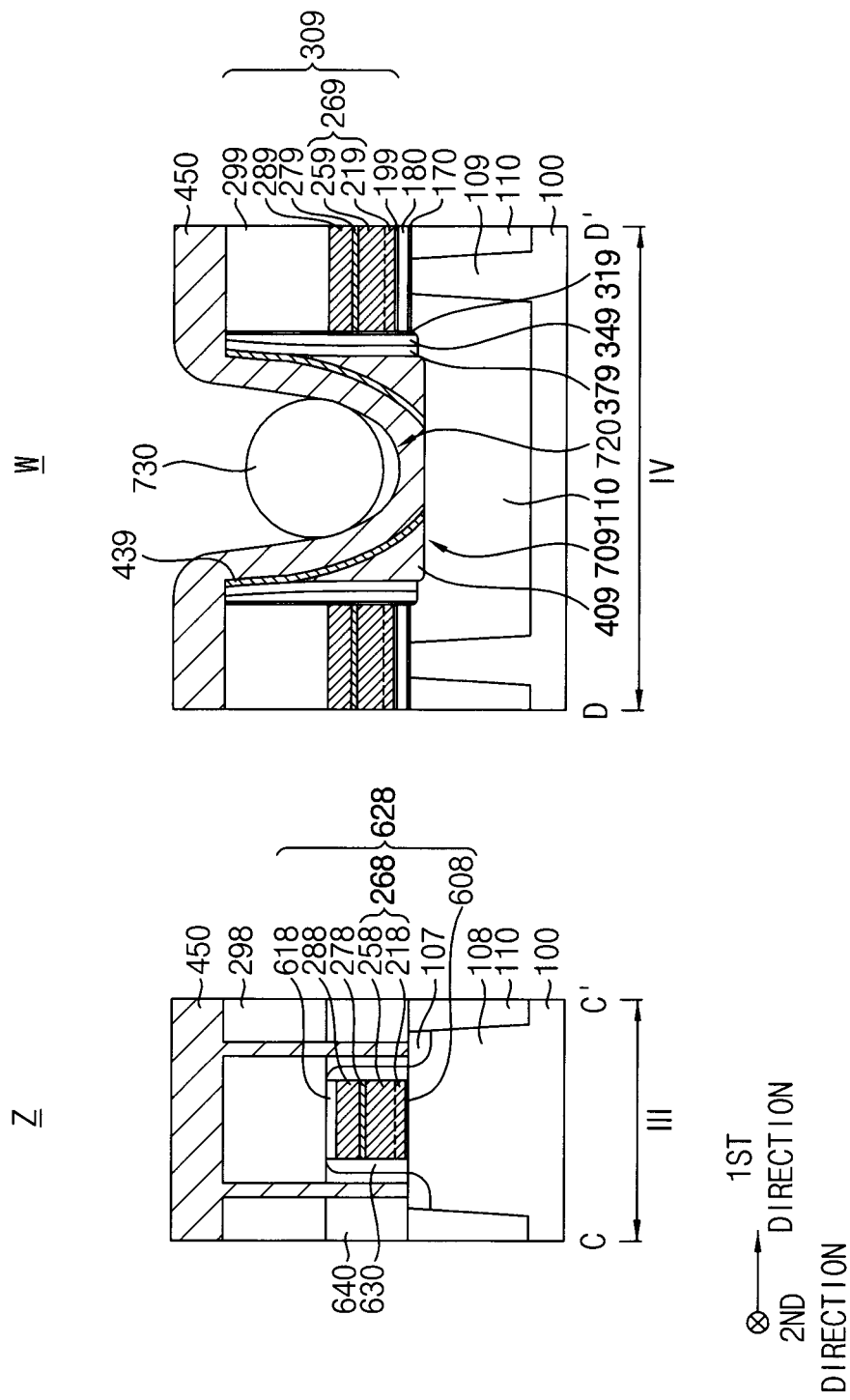

Referring to FIG. 42, processes substantially the same as or similar to FIGS. 26 to 29 may be performed.

For example, the upper contact plug layer 450 may be formed on the first and second metal silicide patterns 435 and 439, and a CMP process may be performed on the upper contact plug layer 450. A portion of the upper contact plug layer 450 on the fourth region IV of the substrate 100 may have a constant thickness on the second insulation layer 180, the second metal silicide pattern 439 and he key structures 309 with a large height difference between a portion on the second insulation layer 180 and a portion on the key structures 309. Additionally, the third trench 720 on the upper contact plug layer 450 may have a slanted sidewall with respect to the upper surface of the substrate 100, and the slurry particle 730 used in the CMP process may not be entirely removed but partially remain.

The cleansing process illustrated with reference to FIG. 30 may be performed, however, only a portion of the slurry particle 730 stuck in the deep third trench 720 may be removed, and most portion thereof may remain in the third trench 720. Thus, the remaining slurry particle 730 may damage other layer structures.

As the third trench 720 has the slanted sidewall, the process for patterning the upper contact plug layer 450 using the third trench 720 as an overlay key to form the wiring 458 may have alignment problems unlike the process as described with reference to FIGS. 31 and 32.

Unlike the comparative embodiment, in the method of manufacturing the semiconductor device in accordance with example embodiments, before forming the CMP process on the lower contact plug layer 400, a melting process, e.g., a laser annealing process may be performed so as to decrease the height difference, and by the etch back process, the filling pattern 409 may fill a lower portion of the second trench 709 and have a flat upper surface.

Accordingly, since the third trench 720 on the upper contact plug layer 450 may not be deep, the slurry particle 730 remaining after the CMP process may not be stuck in the third trench 720, and thus may be easily removed by the cleansing process. Additionally, the third trench 720 may have an almost vertical sidewall, and thus the wiring 458 may be easily formed by using the third trench 720 as an overlay key.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. A method of manufacturing a semiconductor device, the method comprising:
    forming a plurality of first structures and a plurality of key structures on a first region and a second region, respectively, of a substrate, the second region surrounding the first region, the plurality of first structures being spaced apart from each other by a first trench, and the plurality of key structures being spaced apart from each other by a second trench;
    forming a first filling layer on the plurality of first structures and the plurality of key structures to fill the first trench and the second trench, wherein the first filling layer has a first height difference among portions of the first filling layer;
    performing a melting process on the first filling layer to form a second filling layer, wherein the second filling layer has a second height difference among portions of the second filling layer, the second height difference being smaller than the first height difference;
    planarizing the second filling layer until upper surfaces of the plurality of first structures and the plurality of key structures are exposed to form first and second filling patterns between the plurality of first structures and between the plurality of key structures, respectively;
    removing upper portions of the first and second filling patterns;
    forming a conductive layer on the first and second filling patterns, the plurality of first structures, and the plurality of key structures;
    planarizing the conductive layer to form a planarized conductive layer; and
    patterning a first portion of the planarized conductive layer on the first region of the substrate using a second portion of the planarized conductive layer on the second filling pattern as an overlay key,
    wherein the second portion of the planarized conductive layer includes an upper surface defining a third trench as the overlay key.

2. The method according to claim 1,
    wherein the melting process includes a laser annealing process.

3. The method according to claim 1,
    wherein the first filling layer includes doped polysilicon, oxide or nitride.

4. The method according to claim 1,
wherein each of planarizing the first filling layer and planarizing the conductive layer is performed by a CMP process.

5. The method according to claim 4, further comprising:
performing, after planarizing the conductive layer by the CMP process, a cleansing process on the planarized conductive layer.

6. The method according to claim 1,
wherein removing the upper portions of the first and second filling patterns is performed by an etch back process.

7. The method according to claim 1,
wherein a width of the second trench is greater than a width of the first trench.

8. The method according to claim 1,
wherein the plurality of first structures include a plurality of bit line structures.

9. The method according to claim 8,
wherein the first region of the substrate includes a cell region and a peripheral circuit region at least partially surrounding the cell region, and
wherein patterning the first portion of the planarized conductive layer on the first region includes patterning the first portion of the planarized conductive layer on the cell region of the substrate to form an upper contact plug between two adjacent bit line structures of the plurality of bit line structures.

10. A method of manufacturing a semiconductor device, the method comprising:
forming a plurality of first structures and a plurality of second structures on a first region and a second region, respectively, of a substrate, the second region surrounding the first region, the plurality of first structures being spaced apart from each other by a first trench having a first width, and the plurality of second structures being spaced apart from each other by a second trench having a second width greater than the first width;
forming a first filling layer in the first trench and the second trench, portions of the first filling layer on the second region of the substrate having a height difference from each other;
performing a melting process on the first filling layer to form a second filling layer, wherein a height difference among portions of the second filling layer is smaller than the height difference among the portions of the first filling layer;
planarizing the second filling layer until upper surfaces of the plurality of first structures and upper surfaces of the plurality of second structures are exposed to form a plurality of first filling patterns between the plurality of first structures and a plurality of second filling patterns between the plurality of second structures, respectively;
removing upper portions of the plurality of first filling patterns and upper portions of the plurality of second filling patterns; and
forming a conductive layer with a third trench on the plurality of first filling patterns and the plurality of second filling patterns.

11. The method according to claim 10,
wherein the melting process includes a laser annealing process.

12. The method according to claim 10, further comprising:
planarizing the conductive layer to form a planarized conductive layer with a fourth trench,
wherein the fourth trench overlaps the second trench,
wherein a depth of the fourth trench is smaller than a depth of the second trench, and
wherein each of planarizing the first filling layer and planarizing the conductive layer is performed by a CMP process.

13. The method according to claim 12, further comprising:
performing, after planarizing the conductive layer by the CMP process, a cleansing process on the planarized conductive layer.

14. The method according to claim 10,
wherein each of the plurality of first structures and each of the plurality of second structures have the same stacked structure.

15. The method according to claim 12, further comprising:
wherein the conductive layer is further formed on the plurality of first filling patterns and between the plurality of first structures on the first region of the substrate, and
wherein the method further comprises patterning the planarized conductive layer on the first region of the substrate, wherein the patterning of the planarized conductive layer includes aligning a mask for patterning the planarized conductive layer using the fourth trench as an overlay key.

16. A method of manufacturing a semiconductor device, the method comprising:
forming a plurality of bit line structures and a plurality of key structures on a cell region and a second region, respectively, of a substrate, the substrate including a first region having the cell region and a peripheral circuit region at least partially surrounding the cell region, the second region surrounding the first region, the plurality of bit line structures being spaced apart from each other by a first trench, and the plurality of key structures being spaced apart from each other by a second trench;
forming a first conductive layer on the plurality of bit line structures and the plurality of key structures to fill the first trench and the second trench;
performing a melting process on the first conductive layer to form a second conductive layer, wherein a height difference among portions of the second conductive layer is smaller than a height difference among portions of the first conductive layer;
planarizing the second conductive layer until upper surfaces of the plurality of bit line structures and upper surfaces of the plurality of key structures are exposed to form a lower contact plug between two adjacent bit line structures of the plurality of bit line structures and a filling pattern between two key structures of the plurality of key structures;
removing an upper portion of the lower contact plug and an upper portion of the filling pattern;
forming a second conductive layer with a third trench on the lower contact plug, the filling pattern, the plurality of bit line structures, and the plurality of key structures;
planarizing the second conductive layer to form a planarized second conductive layer with a fourth trench; and
patterning portions of the planarized second conductive layer on the cell region and the peripheral circuit region, respectively, of the substrate to form an upper contact plug and a wiring, respectively,
wherein patterning of the portions of the planarized second conductive layer includes aligning a mask for the patterning of the portion of the planarized second conductive layer using the fourth trench of the planarized second conductive layer as an overlay key.

17. The method according to claim 16,
wherein the first conductive layer includes doped polysilicon, and
wherein the second conductive layer includes metal.

18. The method according to claim 16, further comprising:
forming a capacitor electrically connected to the upper contact plug.

19. The method according to claim 16,
wherein each of planarizing the first conductive layer and planarizing the second conductive layer is performed by a CMP process.

20. The method according to claim 19, further comprising:
performing, prior to planarizing the second conductive layer by the CMP process, a cleansing process on the second conductive layer.

* * * * *